(12) United States Patent
Green et al.

(10) Patent No.: US 7,301,326 B1
(45) Date of Patent: Nov. 27, 2007

(54) MODULAR INTERFACE

(75) Inventors: Roy W. Green, Tabernacle, NJ (US); Mark A. Bradford, Brentwood, CA (US); Davis S. Dao, San Jose, CA (US); Trung Van Nguyen, San Jose, CA (US); James M. Ogg, Milpitas, CA (US)

(73) Assignee: inTEST Corporation, Cherry Hill, NJ (US)

( * ) Notice: Subject to any disclaimer, the term of this patent is extended or adjusted under 35 U.S.C. 154(b) by 0 days.

(21) Appl. No.: 11/199,646

(22) Filed: Aug. 9, 2005

Related U.S. Application Data

(63) Continuation of application No. 11/180,133, filed on Jul. 13, 2005, now abandoned.

(60) Provisional application No. 60/587,437, filed on Jul. 13, 2004.

(51) Int. Cl.
*G01R 31/02* (2006.01)
*G01R 1/073* (2006.01)

(52) U.S. Cl. .............. 324/158.1; 324/754; 324/761

(58) Field of Classification Search .................. None
See application file for complete search history.

(56) References Cited

U.S. PATENT DOCUMENTS

| | | | | |
|---|---|---|---|---|
| 5,241,870 A | * | 9/1993 | Holt | 73/866.5 |
| 6,275,051 B1 | * | 8/2001 | Bachelder et al. | 324/754 |
| 6,741,089 B2 | * | 5/2004 | Conroy | 324/755 |

* cited by examiner

*Primary Examiner*—Ernest Karlsen
(74) *Attorney, Agent, or Firm*—RatnerPrestia

(57) ABSTRACT

An apparatus for interfacing a test head to a peripheral system is provided. The apparatus includes a first unit having a first connection member for providing electrical communication with the peripheral system, a second unit having a second connection member for providing electrical communication with the test system, and pivot members coupling the first unit and the second unit. The pivot members enable motion in the following sequence as one of the first and second unit moves towards the other: a) pivotal motion between the first connection member and the second connection member; and b) linear motion which decreases linear distance between the first connection member and the second connection member while maintaining respective contact surfaces of the first and second connection members in parallel.

14 Claims, 32 Drawing Sheets

Section A

Section B

Section C

Section D

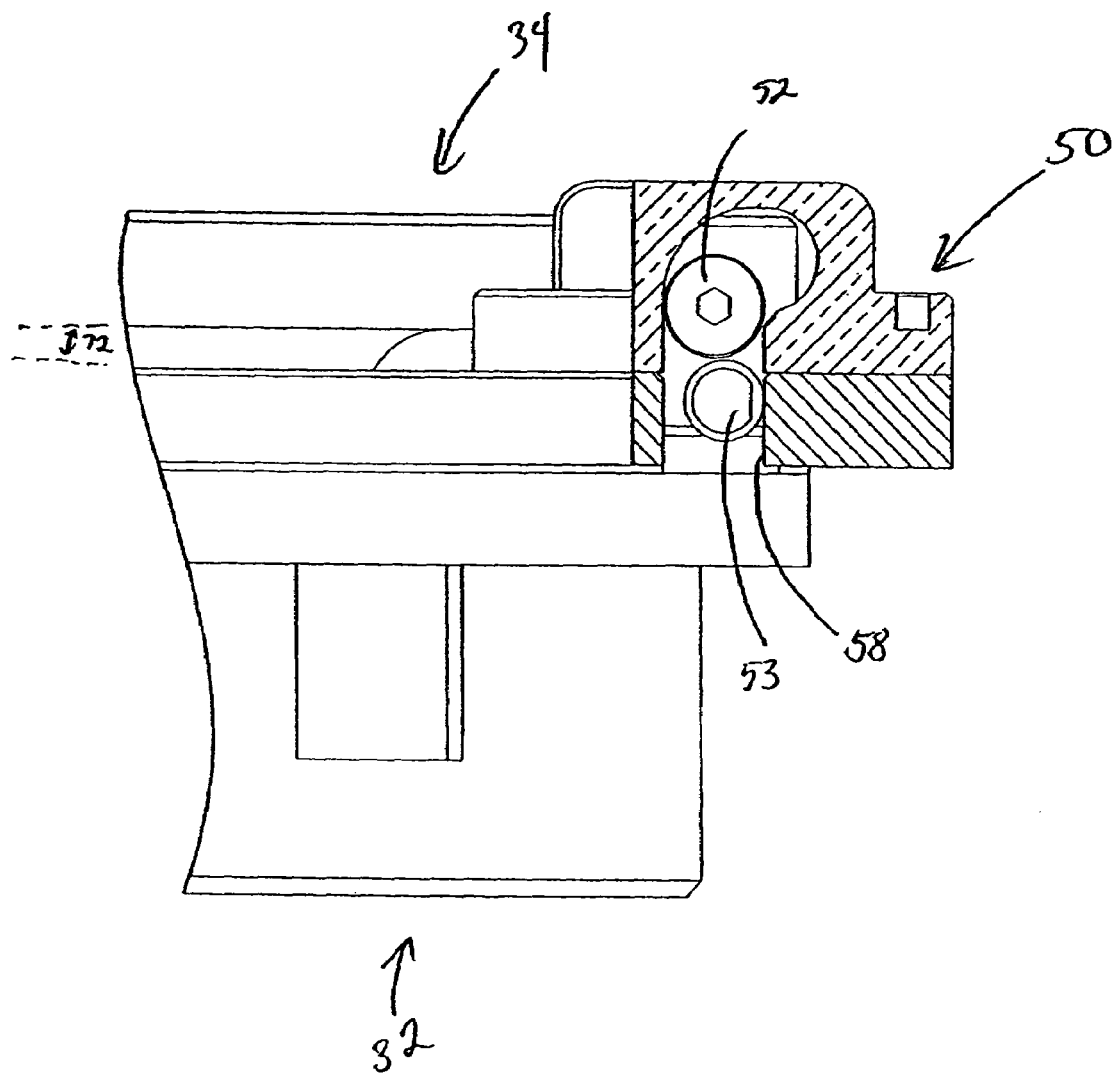

Prior Art

MODULAR INTERFACE

This application is a Continuation of U.S. patent application Ser. No. 11/180,133, filed Jul. 13, 2005 now abandoned, which application claims the benefit of Provisional Patent Application No. 60/587,437, filed Jul. 13, 2004.

FIELD OF THE INVENTION

The present invention relates to the field of electronic interfacing and more specifically to electronic interfacing during semiconductor testing. In particular, an apparatus and method are disclosed for performing electronic interfacing in order to perform semiconductor testing.

BACKGROUND OF THE INVENTION

In the manufacture of integrated circuits (ICs) and other electronic devices, testing with automatic test equipment (ATE) is performed at one or more stages of the overall process.

A special handling apparatus is used to place one or more devices under test (DUT or DUTs) into position for testing. In some cases, the special handling apparatus may also bring the DUT or DUTs to the proper temperature and/or maintain it at the proper temperature to be tested. The special handling apparatus is of various types including "wafer probers" or "probers" for testing unpackaged devices on a wafer and "device handlers" or "package handlers" for testing separated or non-separated packaged parts; herein, "peripheral" or "peripherals" will be used to refer to all types of such apparatus. Also the acronym DUT may be used to refer to either a single device under test or a set of devices simultaneously under test.

The electronic testing itself is provided by a large and expensive ATE system. The DUT requires precision, high-speed signals for effective testing. Accordingly, the "test electronics" within the ATE, which are used to test the DUT, are typically located in a "test head," which must be positioned as close as possible to the DUT. The test head is extremely heavy: the size and weight of the test heads have grown from a few hundred pounds to as much as three to four thousand pounds.

In order to use a test head to test integrated circuits, the test head is typically "docked" to a peripheral. When docked, the test head must be located as close as possible to the peripheral's test site in order to minimize signal degradation. A test head positioning system, including a test head manipulator and a docking apparatus, may be used to position the test head with respect to the peripheral and may be designed to facilitate flexible docking and undocking of a test head with a variety of peripherals. With the test head in docked position, a batch of devices, generally all of the same type, may be tested. In general a set of DUTs are tested simultaneously in parallel. Depending upon the overall system the number of DUTs in a set may range from one to 16 or more in a packaged device handler. In wafer probing the number of devices tested at one time has grown to dozens with an ultimate goal of testing all devices on the wafer in parallel. The peripheral places each set of DUTs in turn in position to be tested. For the purposes of this document "DUT" will hereinafter refer to either a single device under test (i.e., a set of one) or a set comprising a plurality of devices to be tested simultaneously.

After the testing of a particular DUT type is complete, the test head may be undocked from the peripheral and moved away from using a test head manipulator. If desired, another DUT type may be loaded into the peripheral, and the test head is docked again to the peripheral to perform electronic testing. When changing over from testing one type of device to another, it is usually necessary to reconfigure the system by changing one or more units such as Performance Boards, DUT boards, and/or probe cards which adapt the test head and peripheral to the particular DUT. More will subsequently be said about such units.

It is furthermore often desirable to dock a given test head with different peripherals from time to time. For example, testing may be performed with a certain packaged device handler for a time, and then it may be desired to change to another packaged device handler. In other situations, it may be desired to change over from a wafer prober to a packaged device handler or conversely. In such cases the test head is undocked from the original peripheral, which is then moved out of the way. The new peripheral is then moved into place, and the test head is docked with it. In other situations both peripherals are in position to be used, and the test head may be undocked from the first peripheral and then moved to and docked with the second peripheral. It is often also desirable to move the test head away from a peripheral to perform maintenance. Thus, it may be required to easily dock and undock the test head with a variety of different peripherals. In all of these situations the heavy test head is typically maneuvered from position to position using a test head manipulator.

An electrical "interface system" or "interface" connects the test head with the peripheral's test site where the DUT is electrically tested. Generally, a performance board is attached to the test head to adapt the test head to a particular type of DUT or family of DUT types. The performance board generally includes conductive paths from the test electronics in the test head to a set of conductive pads arranged in a planar pattern. A second board for contacting the DUT is also provided. If the testing is performed on a prober type of peripheral, the DUT-contacting board is typically a probe card having needle like conductive contacts used to make electrical connection to the tiny connection pads on the chip itself. If packaged parts are tested using a handler, a DUT board including suitable contact devices to electrically connect with the "pins" of the DUT is used. Thus, a DUT board might include an appropriate test socket. In many situations the probe card or DUT board has conductive pads in a planar pattern that is the same as that of the DIB or load board. An interface system provides mechanical coupling and electrical interconnections between the performance board and the DUT-contacting board. In many situations the DUT-contacting board may be held in place by the interface unit which in turn is secured to the peripheral. In other situations the DUT-contacting unit may be held by the peripheral and the interface is separately aligned and secured to the peripheral. Typically, spring-loaded electrical contacts, commonly known as spring pins or Pogo Pins®, are disposed on each side of the interface to provide the electrical signal paths between the conductive pads on the probe card or DUT board and the conductive pads on the DIB or Load Board attached to the ATE. In situations where the contact patterns on the performance board are the same as on the DUT-contacting board, double-ended, spring pins may be used to realize the signal paths and electrical contacts. The interface may include hundreds or thousands of such electrical contacts, which are of necessity small and fragile. Typically, the contacts are arranged in a generally planar fashion on each side of the interface. When the test head is docked to the peripheral through the interface, electrical connections are thus made by the contacts on the two sides of the interface between the probe card or DUT board and performance board attached to the test head.

A typical interface common in the art is an apparatus with two hingeably connected units. The bottom unit or first unit attaches to the peripheral and holds the probe card or DUT board in a proper alignment for testing. The lid unit, or second unit, contains the electrical contacts used to complete the electrical signal paths between the probe card or DUT board and the performance board attached to the test head. Preparation for testing begins with the interface attached to a peripheral by the first unit and in an open position. A probe card or DUT board is placed into the first unit, properly aligned, and secured. A performance board is attached to the test head. The second unit is then pivoted towards and locked against the first unit to bring the electrical contacts on the one side of the second unit into contact with the probe card. The test head is then docked to the peripheral, making contact between the electrical contacts on the other side of the second unit and the conductive pads on the performance board, thus completing the electrical connections between the test head and the peripheral's test site. The DUT is then positioned for testing by the peripheral, completing the connection between the DUT and the test head; and the electrical signal tests are then run. Once testing is complete, the test head may be undocked from the peripheral. The interface is unlocked, and the second unit is moved away from the first unit. The probe card or DUT board may be removed to allow for installation of another probe card or DUT board for testing further device types.

It is well understood that, when docking the test head, the test head is typically first planarized with respect to the interface, aligned linearly in two dimensions, and aligned rotationally about an axis perpendicular to the plane of the interface. The test head may then be advanced along a linear path into a docked position. The docking apparatus desirably provides a means to establish the final docked distance (or "height") between the test head and the peripheral such that the electrical contacts are satisfactorily mated (that is, with sufficient compression, to assure a low resistance connection) and such that the test head does not over-travel and thus damage or destroy the contacts. Interfaces are typically changed when operation is switched from one peripheral to another; indeed, each peripheral may have its own interface attached to it. Further, it is typical that when a single peripheral is used to first test devices of one type and then reconfigured to test devices of another type, the interface may either be changed from a first type to a second type or the probe card (or DUT board) may be changed from a first type to a second type. Generally, the docked height requirement may be different for each testing set up. It is most desirable to have a system where an interface may remain in place on the peripheral and to have a capability to easily change probe cards and/or to reconfigure the interface to change over from one DUT type to another.

The prior art is described with reference to FIG. 16. FIG. 16 has been adapted from U.S. Pat. No. 6,114,869. Referring to FIG. 16, signal interface system 1 includes a first ring unit 3 attached by hinge assembly 8 to second ring unit 11. Second ring unit 11 includes spring-loaded contacts 42. When the interface is closed, spring-loaded contacts 42, held in "POGO tower" 10 engage fixed conductive pads 55 contained on probe card (or DUT board) 6, which is contained in first ring unit 3. As is generally well known and discussed in the '869 patent, it is preferred that when closing an interface of this type second ring unit 11 is first pivoted downwards to a position where the plane of spring-loaded contacts is parallel to the plane of contacts in first ring unit 3. Then the plane of spring-loaded contacts in second ring unit 11 is moved vertically downwards to make compressive contact with the contacts of first ring unit 3. In opening the interface, the reverse procedure is preferred. In this way the contacts are not scraped against one another in a destructive manner. This is accomplished in the interface of FIG. 16 by mounting "POGO tower" 10 to second ring unit 11 with springs. A fixed hinge enables second unit 11 to be rotated to a position where the plane of the spring-loaded contacts 42 is essentially parallel to and spaced slightly apart from the plane of conductive pads 55. Rotating lock ring 16 by means of handle 4 moves "POGO tower" 10 downwards or upwards respectively bringing spring-loaded contacts 42 into or out of engagement with conductive pads 55. Although this approach is protective of the contacts in normal operation, it is disadvantages in the event second unit 11 is closed abruptly with excessive force (i.e., slammed shut) in which case POGO tower 10 may bounce to such a degree that contacts 42 could be damaged. Additionally, repeatability of planarity between contacts 42 and conductive pads 55 prior to rotating handle 4 is dependent upon the mounting springs having uniform characteristics throughout their lives.

SUMMARY OF THE INVENTION

An apparatus for interfacing a test head to a peripheral system includes a first signal unit having a first connection member for providing electrical communication with the peripheral system, a second signal unit having a second connection member for providing electrical communication with the test system, and pivot members coupling the first signal unit and the second signal unit. The pivot members enable motion in the following sequence as the second signal unit moves toward the first signal unit: a) pivotal motion between the first connection member and the second connection member; and b) linear motion which decreases linear distance between the first connection member and the second connection member while maintaining respective contact surfaces of the first and second connection members in parallel. The pivot members also enable motion in the following sequence as the second unit moves away from the first unit: a) linear motion which increases linear distance between the first connection member and the second connection member while maintaining respective contact surfaces of the first and second connection members in parallel; and b) pivotal motion between the first connection member and the second connection member.

DETAILED DESCRIPTION OF THE INVENTION

Figure 1:
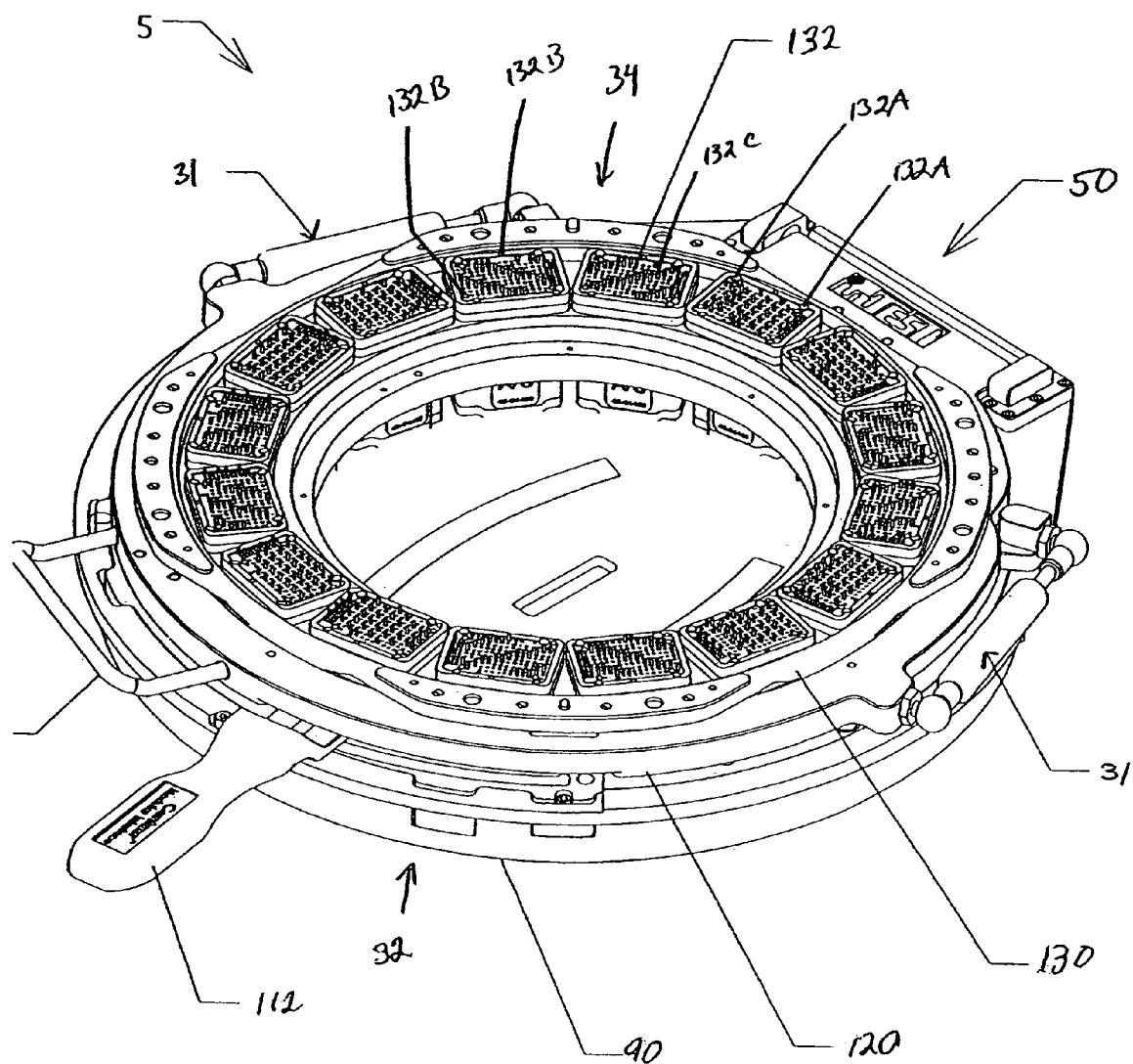
FIG. 1 is a perspective view of a signal delivery system in accordance with an exemplary embodiment the present invention.

FIG. 1 is a perspective view of a signal delivery system 5 in accordance with an exemplary embodiment of the present invention. Signal delivery system 5 is depicted in a closed position, in which first signal unit 32 and second signal unit 34 (hereinafter "signal units" when discussed as a pair) are in contact with one another and are substantially parallel to one another.

Figure 2:
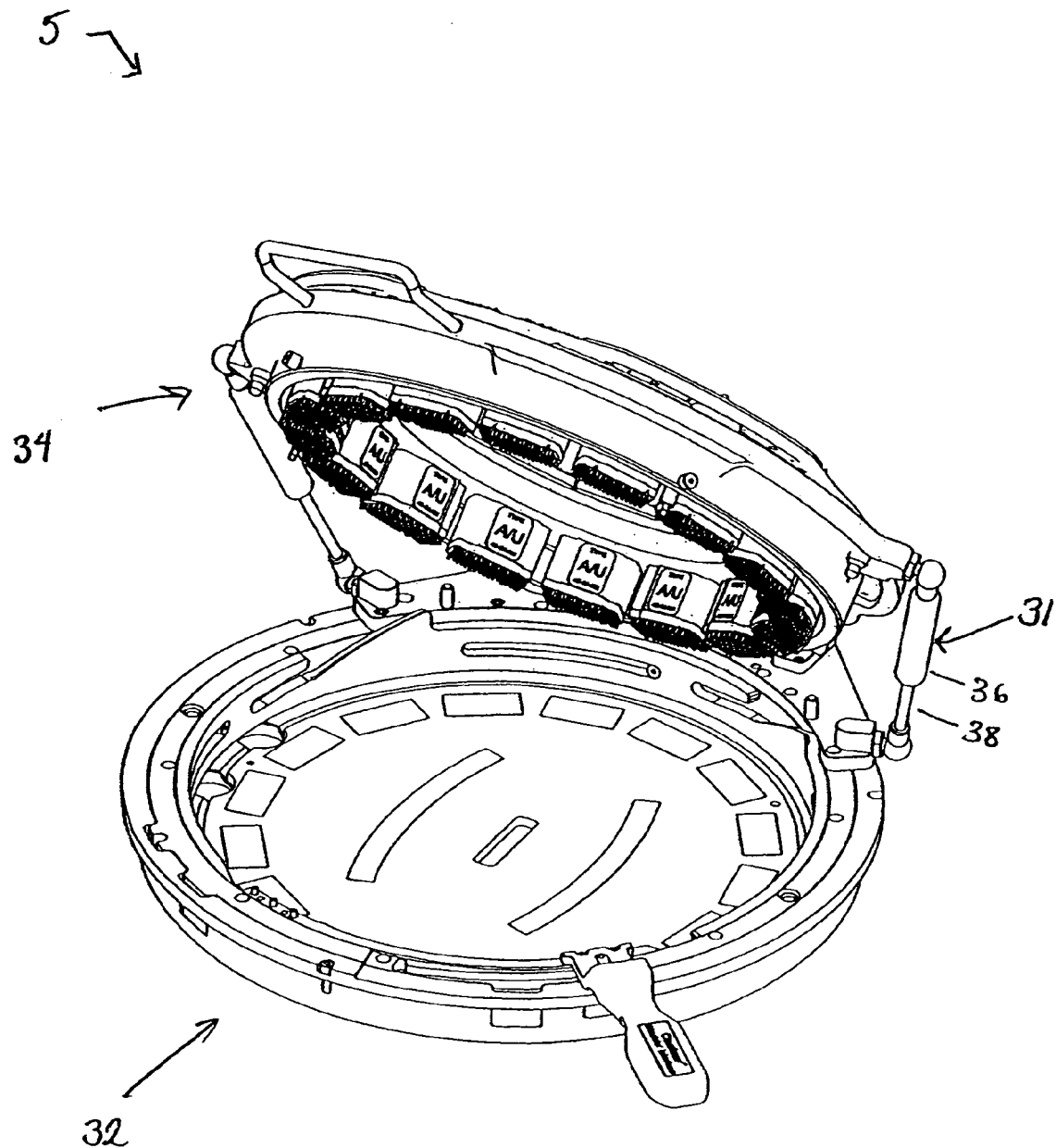
FIG. 2 is a perspective view of the signal delivery system of FIG. 1 showing a second unit fully pivoted away from a first unit and struts fully extended.

FIG. 2 shows a perspective view of signal delivery system 5 of FIG. 1 in an open position, in which first signal unit 32 and second signal unit 34 are angularly distanced from each another.

An exemplary embodiment of the present invention includes pivot members which connect the signal units and which constrain the types of motion which occurs between the signal units as they are drawn together or drawn apart. In an exemplary embodiment, the pivot members include struts 31 and pivot assembly 50, all of which are shown in FIGS. 1 and 2.

Pivot assembly 50 connects first signal unit 32 and second signal unit 34 and assists and restricts motion between the two units to pivoting motion and linear motion. Further details of how pivot assembly 50 assists and restricts the movement of the signal units are described below in FIGS. 12 and 13A to 13E.

Strut 31 opposes forces which tend to compress its length. In one embodiment, strut 31 consists of a strut cylinder 36 and a strut piston 38. As strut 31 is compressed, strut piston 38 is pushed into strut cylinder 36, thereby decreasing the volume of the inside of strut cylinder 36. In one exemplary embodiment, strut cylinder 36 contains a gas which, as it is compressed, provides the force which opposes the reduction of the length of strut 31. In another exemplary embodiment, strut cylinder 36 contains a spring which, as it is compressed, provides the force which opposes the reduction of the length of strut 31.

One end of strut 31 is connected to first signal unit 32. The other end of strut 31 is connected to second signal unit 34. The connection of strut 31 to first signal unit 32 is closer to pivot assembly 50 than is the connection of strut 31 to second signal unit 34. This arrangement causes any compression of strut 31 to provide forces that tend to generally pivot second ring unit 34 away from first signal unit 32. In one instance, struts 31 provide a controlled, cushioned descent of second ring unit 34. In another instance, struts 31 hold signal delivery system 5 open.

Figure 3:
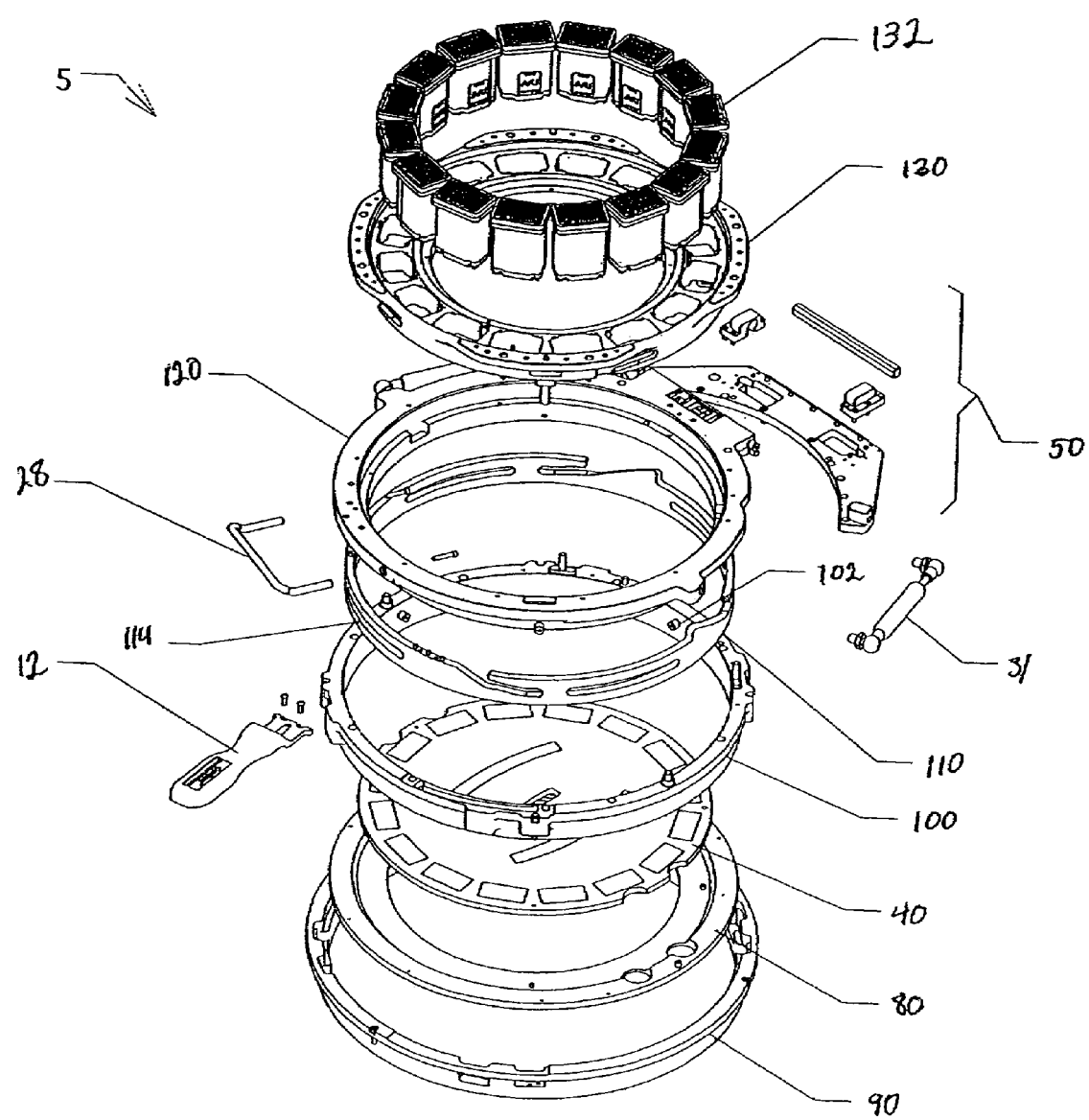
FIG. 3 is an exploded perspective view of the signal delivery system of FIG. 1.

An exemplary assembly of the signal units will now be generally described with reference to FIG. 3. A specific, detailed description of the various signal units of signal delivery system 5 will then follow. A description of how the signal units are assembled into signal delivery system 5 will then be provided with reference to FIG. 3.

A general description of the signal units is first provided. Referring now to FIG. 3, an exemplary embodiment of the present invention is shown in which the signal units exist in the form of circular rings. Second signal unit 34 consists of a second ring 120, a module housing 130, and at least one signal module 132. First signal unit 32 consists of a prober adapter ring 90, a first ring 100, a probe card 40, a probe card tray 80, and a compression ring 110. In this illustrative embodiment a probe card is used; however, a DUT board could just as well be used. In this event probe card tray 80 would be used to hold the DUT board.

Figure 4:
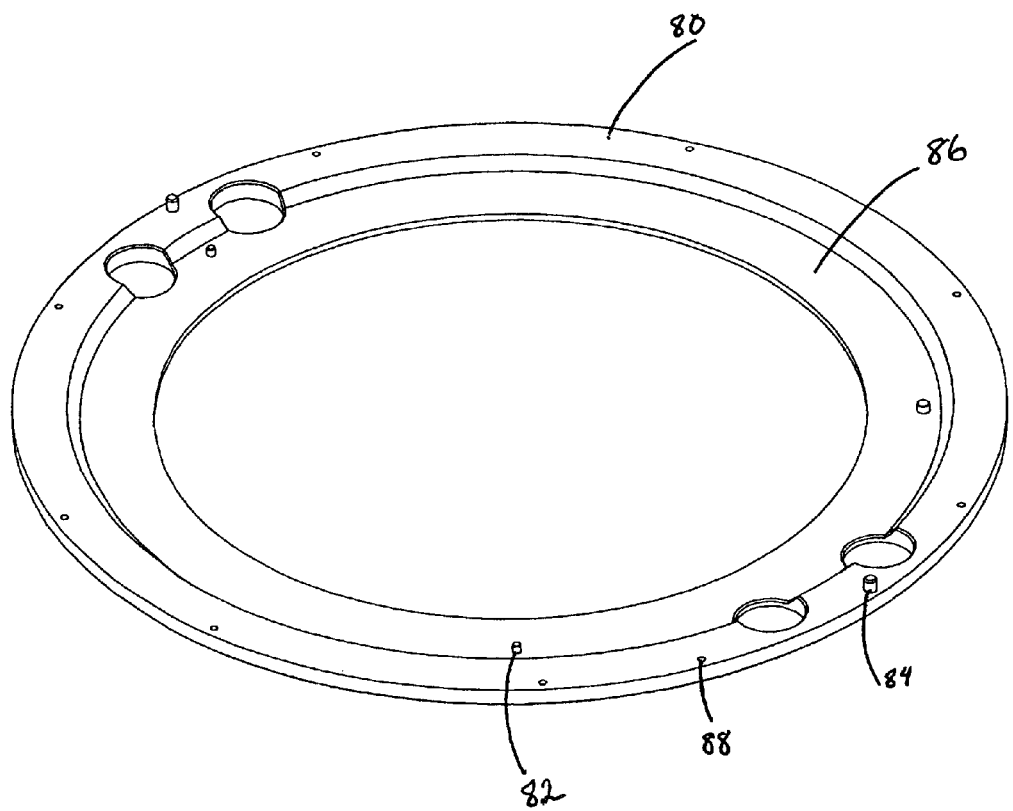
FIG. 4 is a perspective view of a probe card tray.

A detailed description of each ring of signal delivery system 5 now follows. Shown in FIG. 4 is a perspective view of probe card tray 80. Support annulus 86, which defines an interior surface of probe card tray 80, contains a plurality of probe card alignment pins 82. The outer edge of the upper major surface of probe card tray 80 has a plurality of alignment pins 84 and screw holes 88. In an exemplary embodiment, the top surface of support annulus 86 is lower than the upper major surface of probe card tray 80 to establish a desired distance between a device under test (not shown) and probe pin 132C (not shown) of signal module 132 when signal delivery system 5 is closed.

Figure 5:
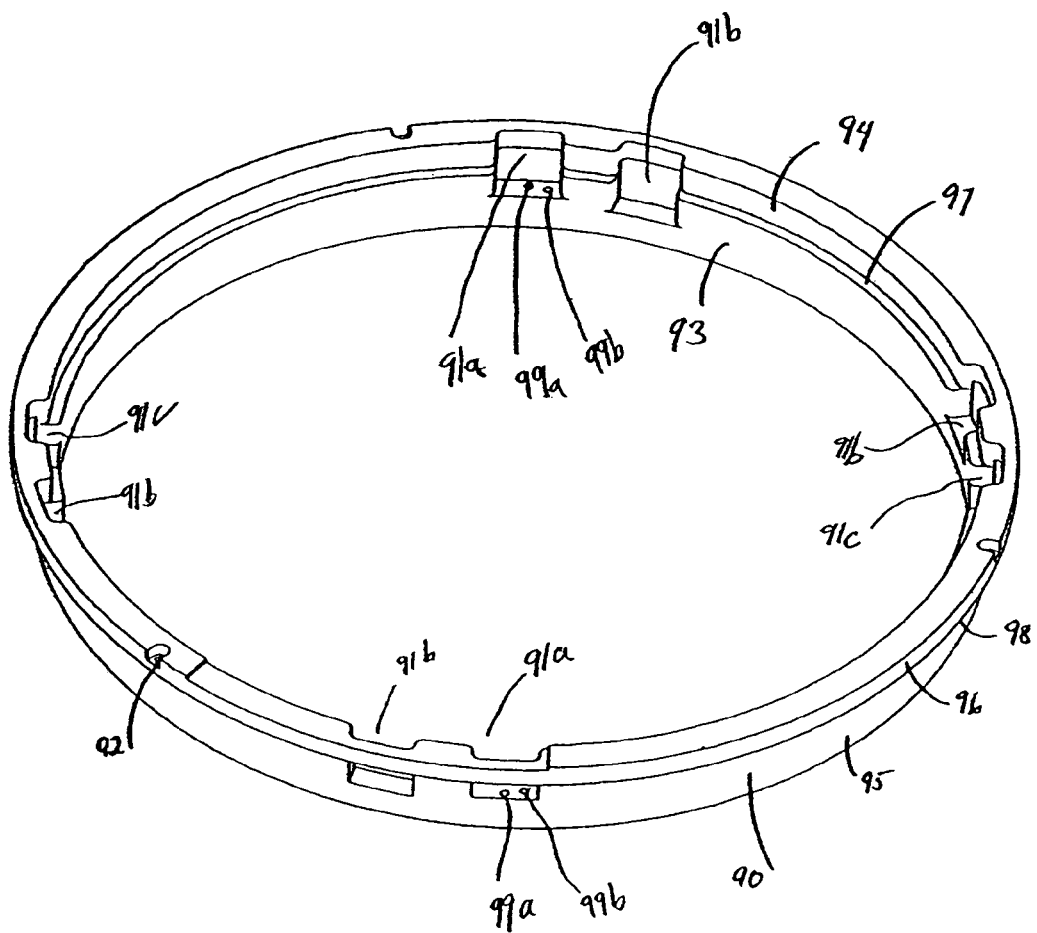
FIG. 5 is a perspective view of a prober adapter ring.

FIG. 5 depicts a perspective view of an exemplary peripheral adapter unit in the form of peripheral adapter ring 90. A peripheral adapter unit (also referred to as a probe adapter) is used to enable an interface to be used with a variety of different makes and models of peripherals. Peripheral adapter ring 90 adapts signal delivery system 5 to a peripheral (not shown). The interior surfaces of peripheral adapter ring 90 include two cylinders which have a central axis common to peripheral adapter ring 90: a lower interior cylinder 93 and an upper interior cylinder 94, which has a diameter greater than that of lower interior cylinder 93 to form edge 97. The exterior surfaces include two cylinders which have a central axis common to peripheral adapter ring 90. These include a lower exterior cylinder 95 and an upper exterior cylinder 96, which has a diameter greater than that of lower exterior cylinder 95 to define support edge 98. Peripheral adapter ring 90 sits on support edge 98 within a circular cutout in a peripheral and contains a plurality of fastener holes 92 through which a fastener such as a bolt, screw, or other device passes to anchor it to the peripheral. Internal recessed slots 91*a,b,c* and holes 99*a,b,c* are used to align and secure with screws first ring 100, which is next described. Recessed slots 91*a* include two holes 99*a,b*; recessed slots 91*b* do not include holes; and recessed slots 91*c* include single holes 99*c* (not visible) each.

Figure 6A:
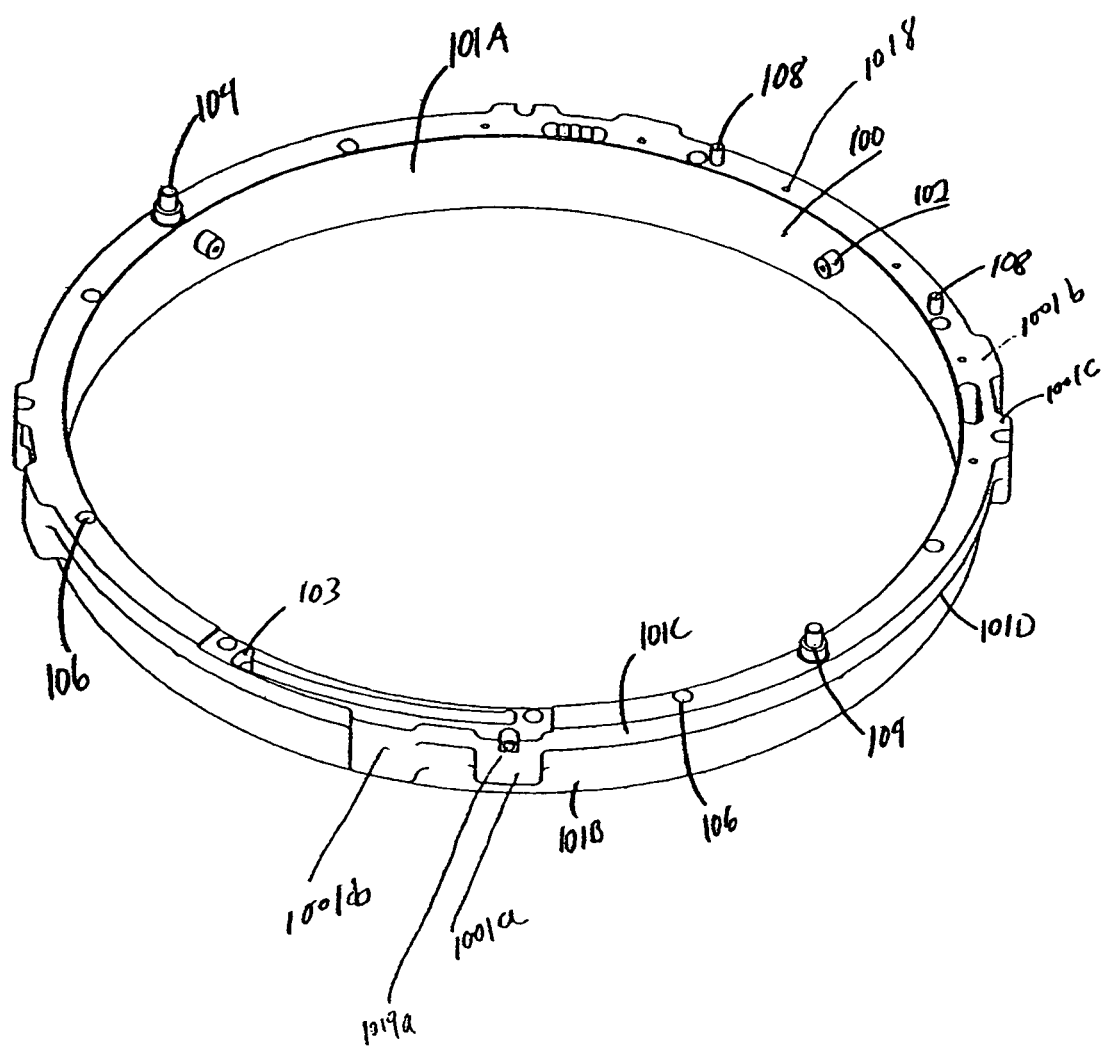
FIG. 6A is a perspective view of a first ring.
Figure 6B:
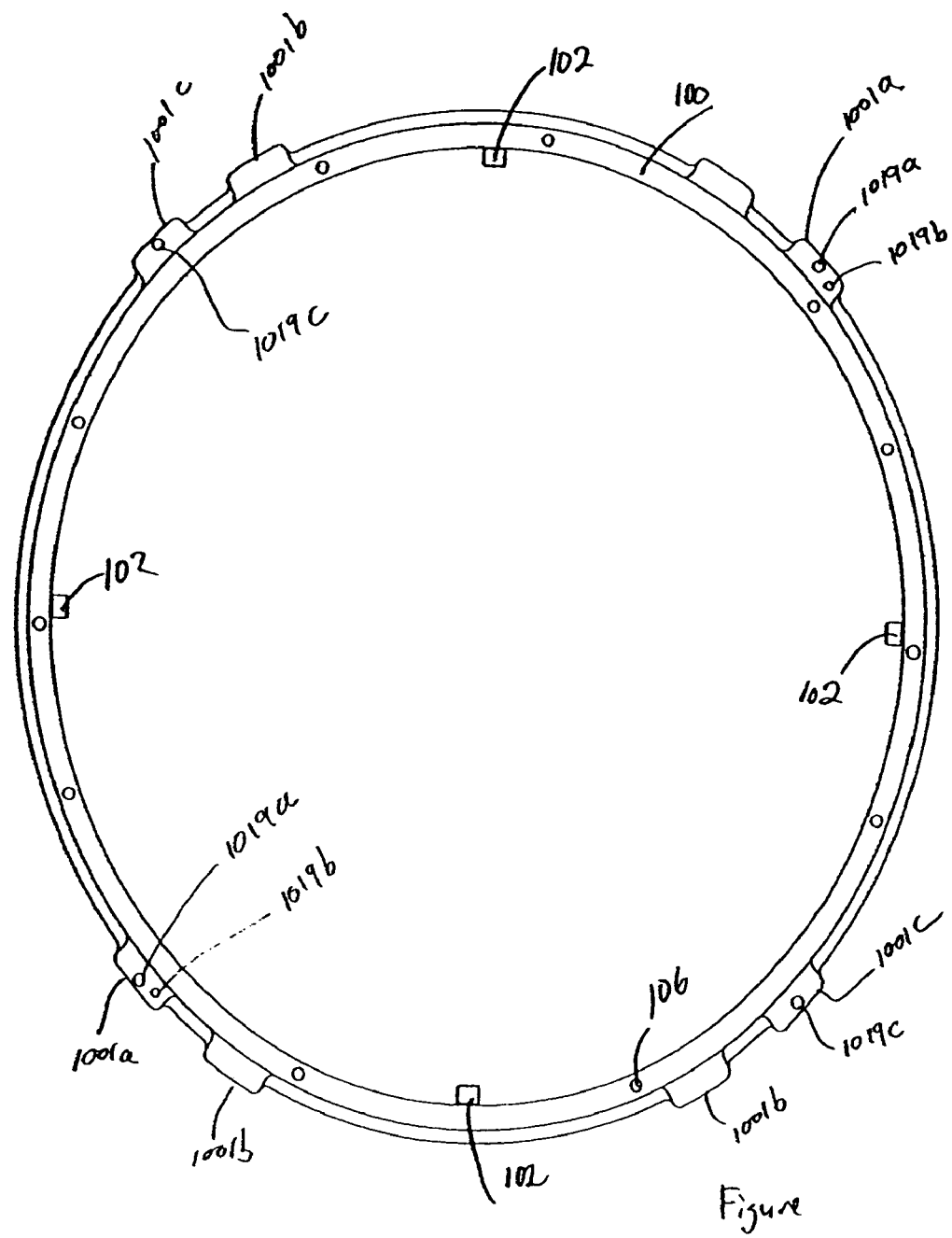
FIG. 6B is a bottom view of the first ring of FIG. 6A.

Shown in FIGS. 6A and 6B are various views of first ring 100 which exemplifies a first subunit in an exemplary embodiment of the present invention. Turning now to FIG. 6A, there is shown a perspective view of first ring 100 which is described generally by the following cylindrical portions which have a central axis common to first ring 100: interior cylinder 101A, lower exterior cylinder 101B, and upper exterior cylinder 101C, which has a diameter greater than lower exterior cylinder 101B to establish support edge 101D. Also included on the exterior of first ring 100 are bosses 1001*a,b,c*, which correspond respectively with recessed slots 91*a,b,c* respectively in peripheral adapter ring 90. Referring also to the bottom view of first ring 100 shown in FIG. 6B, bosses 1001*a* have two holes each corresponding respectively to holes 99*a,b* in recesses 91*a*; bosses 1001*b* do not have holes, and bosses 1001*c* have single holes 1019*c* correspond respectively to holes 99*c*. First ring 100 fits within peripheral adapter ring 90. The fit of bosses 1001*a,b,c* within their respective recesses 91*a,b,c* provides initial alignment of the two parts. Alignment pins (not shown) fitted for example between holes 99*b* and 1019*b* provide precise alignment between the two. The alignment pins may be fitted permanently to either holes 99*b* or 1019*b*. The alignment pins are short, coming into play after first ring 100 has been partially inserted into peripheral adapter ring 90. Holes 99*a* and 99*c* are threaded to receive mounting screws which are passed through holes 1019*a* and 1019*c* respectively to secure first ring 100 to peripheral adapter ring 909.

First ring 100 contains a plurality of fastener holes 106 which pass entirely through it in a direction parallel to the central axis and are available to help secure interface unit 5 to a peripheral. Threaded screw receiving holes 1016 are provided to receive screws for attaching a hinge assembly 50 (see FIG. 3) to first ring 100. On the top major surface of first ring 100 there are a plurality of alignment pins 104 and pins 108. Pins 104 are alignment pins that serve to align second ring 120 with first ring 100; and spring-loaded plunger pins 104 are spring loaded plungers which serve to bias second ring 120 in position when the unit is partially closed. Along the interior surface described by interior cylinder 101A there is attached a plurality of guide cam followers 102 which have a cylindrical shape. The axes of guide cam followers 102 are radially aligned toward the central axis of first ring 100 and are generally uniformly spaced about first ring 100. Finally, there is shown a compression handle pin slot 103 formed in the top major surface of first ring 100.

Shown in FIG. 6B is a bottom view of first ring 100 shown FIG. 6A. The bottom view shows that the axes of guide cam followers 102 are radially aligned toward the central axis of first ring 100 and that fastener holes 106 pass completely through the walls of first ring 100 from the top major surface of first ring 100 to the bottom major surface.

Figure 7A:
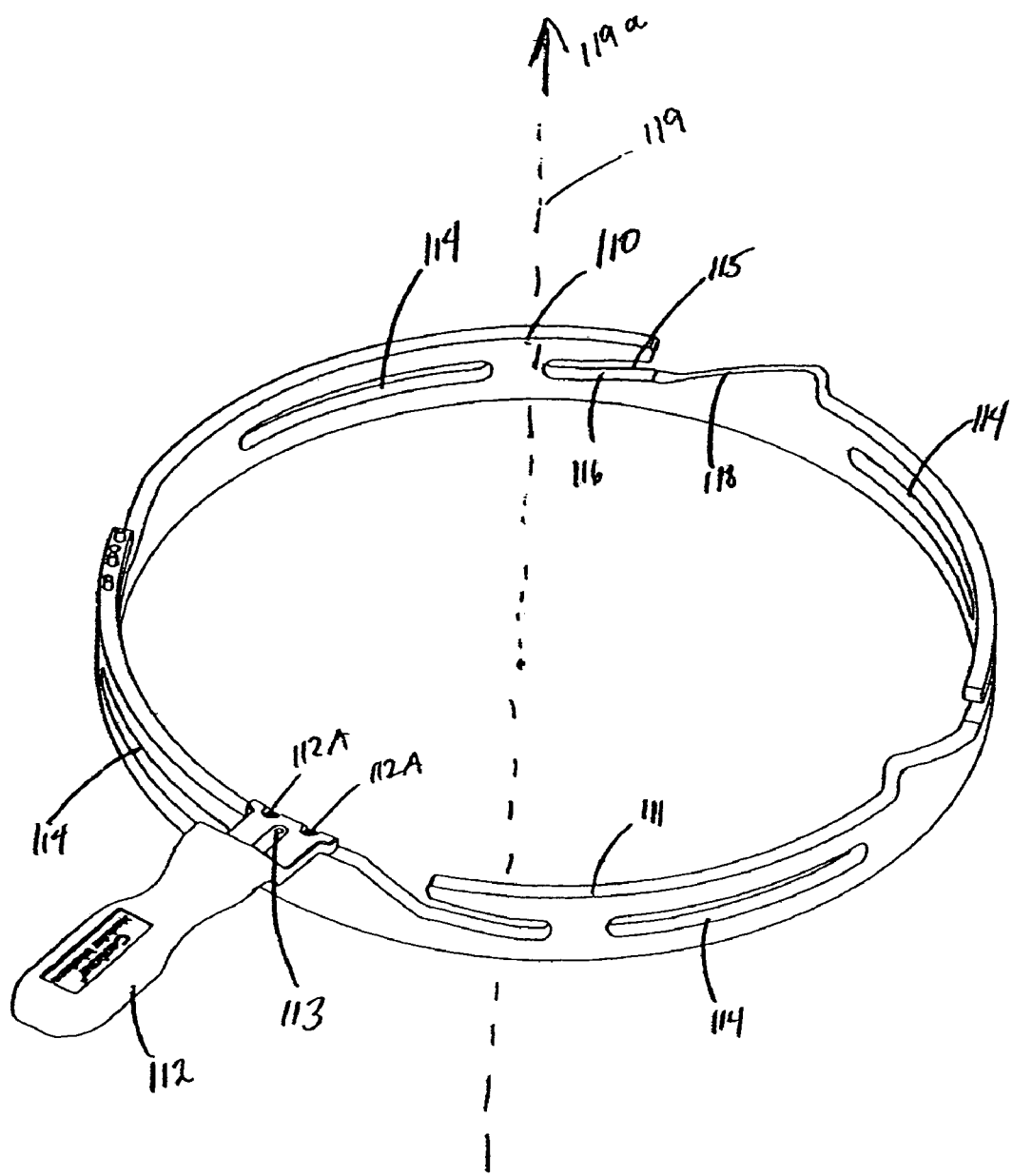
FIG. 7A is a perspective view of a compression ring.
Figure 7B:
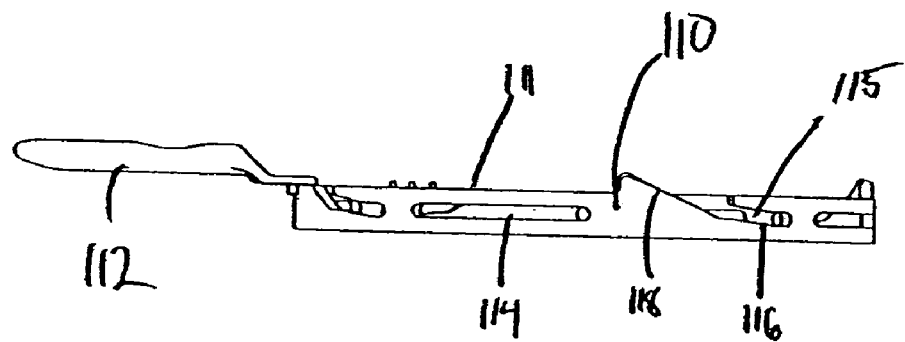
FIG. 7B is a side view of the compression ring of FIG. 7A.
Figure 7C:
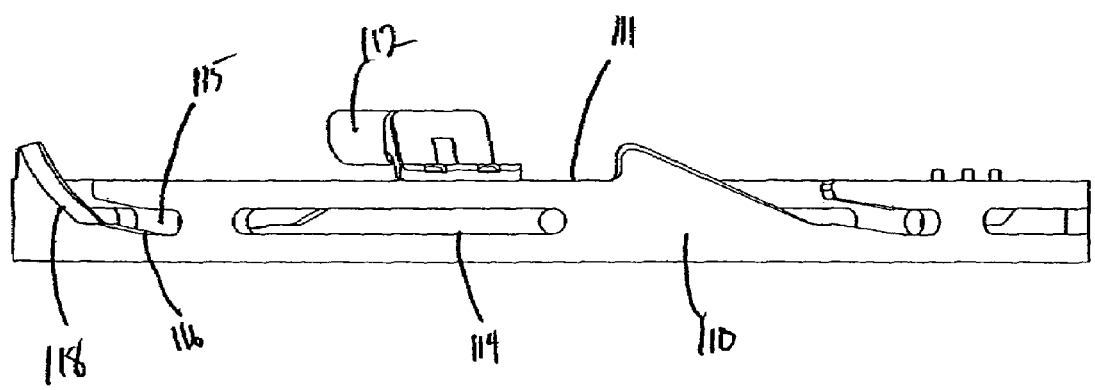
FIG. 7C is another side view of the compression ring of FIG. 7A.

An embodiment of the present invention comprises a compression unit. FIGS. 7A to 7C illustrate various views of compression ring 110, which exemplifies the compression unit. Referring now to FIG. 7A there is shown a perspective view of compression ring 110 which has a generally cylindrical shape with a central axis 119 and top surface 111. The plane of surface 111 is preferably perpendicular to the central axis of the cylinder defining compression ring 110. For purposes of the following discussion, "up" is considered to be in a direction indicated by arrow 119*a* along central axis 119. Attached to top surface 111 by screws 112A is a compression handle 112 with a compression handle pin 113. Within the wall of compression ring 110 is a plurality of guide cam slots 114, which generally form an arc referenced from the central axis of compression ring 110. Guide cam slots 114 are parallel to top surface 111. Also included within the wall of compression ring 110 is at least one camming slot 115 which comprises a second camming surface 116, and at least one first camming surface 118. Second camming surface 116 makes a smooth connection with first camming surface 118 which slopes up away from camming slot 115 toward top surface 111 of compression ring 110. The end of camming slot 115 where first camming surface 118 meets second camming surface 116 is open. Additionally, first camming surface 118 extends above top surface 111. Camming slot 115 is not entirely parallel to surface 111. Proceeding from the point where surface 116 meets surface 118, camming slot 115 first slopes away from surface 111; near the closed end of slot 115, slot 115 changes from being sloped to being parallel to surface 111.

The slopes of camming surfaces 116 and 118 in the radial direction from axis 119 are of interest. First we define "alpha" as the angle between the plane defined by surface 111 and the slope of either camming surface 116 or camming surface 118 in the radial direction. Then for camming surface 116, alpha is zero everywhere; that is, camming surface 116 is everywhere parallel to surface 111. However, the slope of camming surface 118 in the radial direction varies along its circumferential length so that camming surface 118 is in effect "twisted." For camming surface 118, alpha is zero at the point where it meets camming surface 116. Proceeding along the length of camming surface 118 from where it meets camming surface 116 to its uppermost point, the magnitude of alpha monotonically increases. At all points of non-zero alpha camming surface 118 is tilted downwards and away from the inside of compression ring 110.

FIG. 7B shows a side view of compression ring 110. As is illustrated, first camming surface 118 slopes up from second camming surface 116 toward top surface 111 and extends beyond. Guide cam slot 114 is substantially parallel to top surface 111. In an exemplary embodiment, second camming surface 118 and camming slot 115 are not parallel to top surface 111 but slope down away from the connection with first camming surface 118, as previously described.

FIG. 7C shows another side view of compression ring 110, illustrating the various slopes of first camming surface 118, second camming surface 116, and camming slot 115. Also shown is guide cam slot 114 which has top and bottom surfaces generally parallel to top surface 111.

Figure 8A:
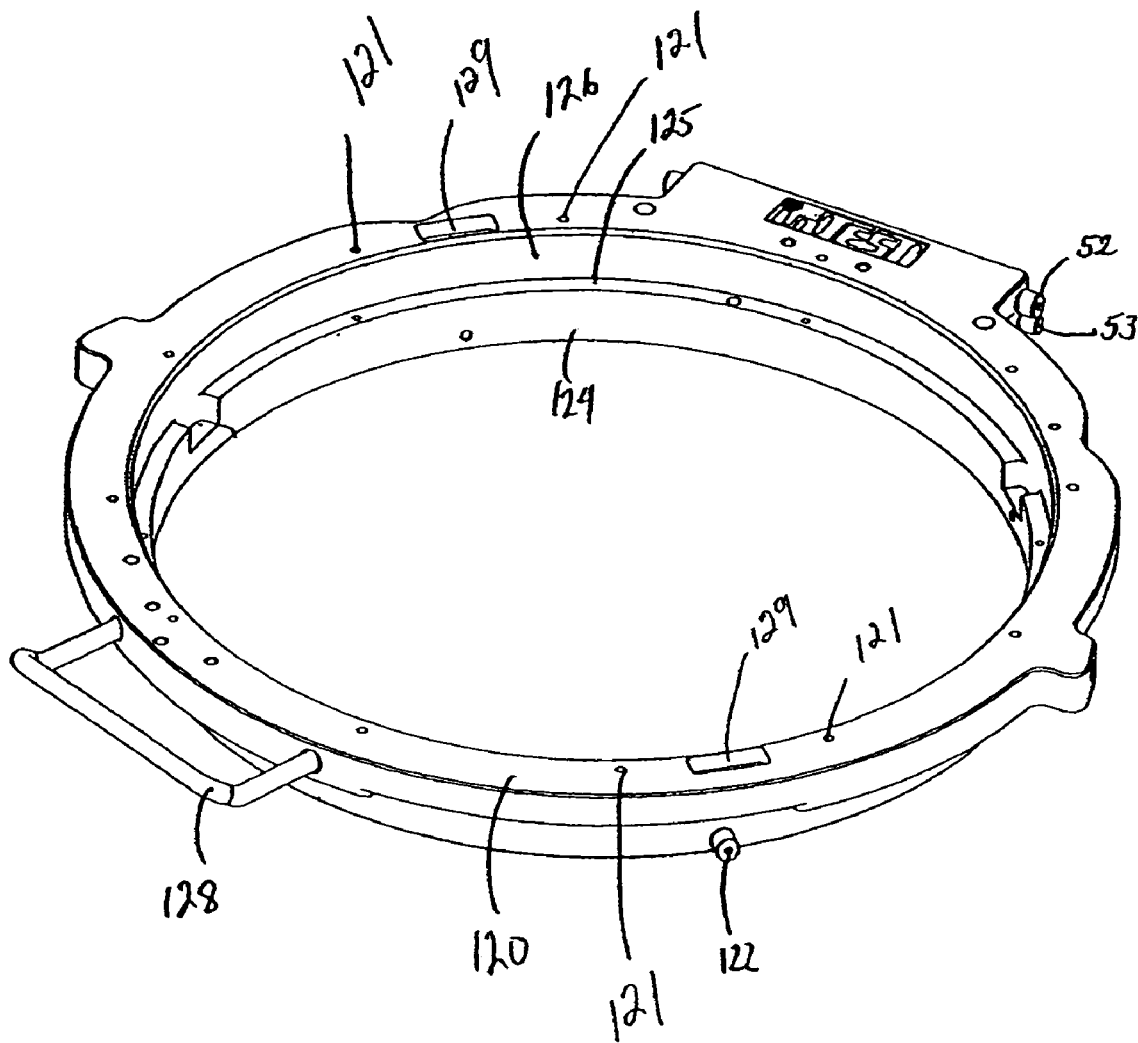
FIG. 8A is a perspective view of a second ring.
Figure 8B:
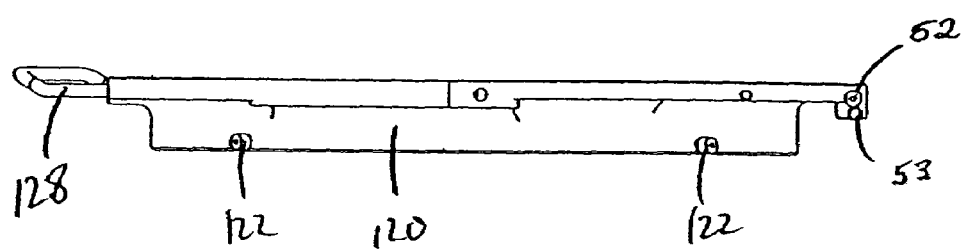
FIG. 8B is a side view of the second ring of FIG. 8A.
Figure 8C:
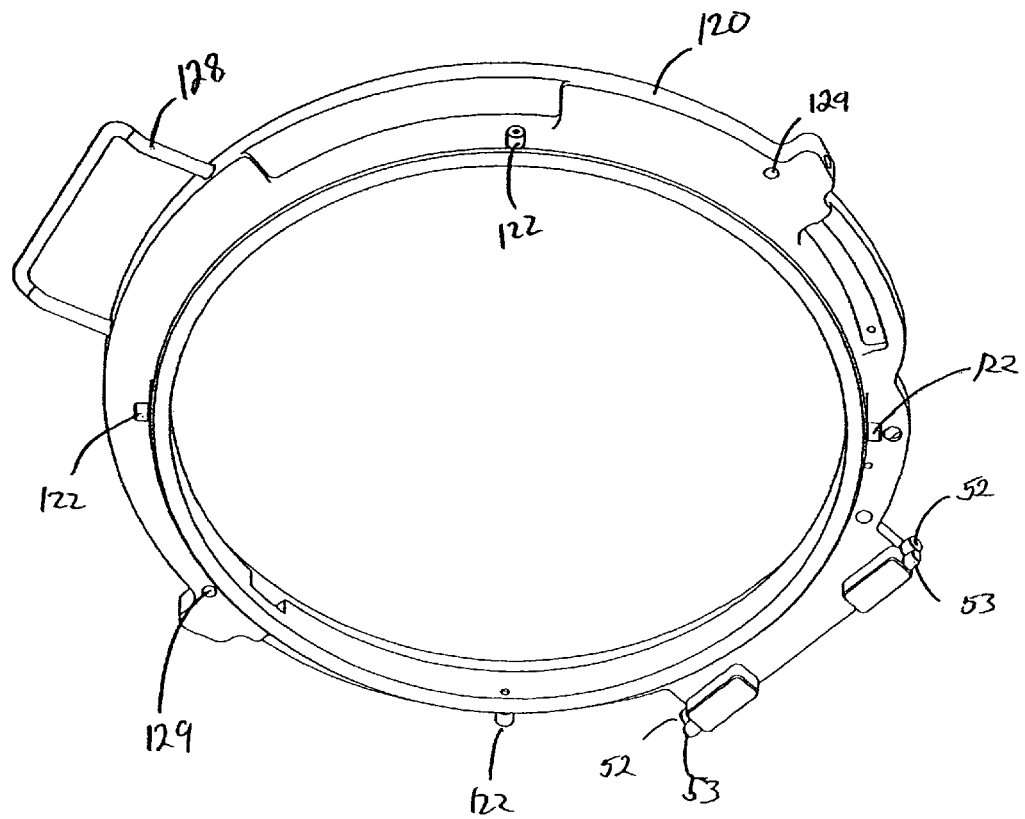
FIG. 8C is another perspective view of the second ring of FIG. 8A.

Depicted in FIGS. 8A through 8C are different views of second ring 120. FIG. 8A is a perspective view of second ring 120 which has a generally cylindrical shape with a central axis. The interior portion of second ring 120 is described by a lower interior cylinder 124 and an upper interior cylinder 126 which has a larger diameter than lower interior cylinder 124 to form edge 125. Attached to an outer surface of second ring 120 is a plurality of cam followers 122 which have a generally cylindrical shape and are aligned so that their cylindrical axes are approximately radial to the central axis of second ring 120. The cylindrical portions of cam followers 122 freely rotate about their cylindrical axes. Also rigidly attached to an outer surface of second ring 120 is a handle 128. Upper cam follower 52 and lower cam follower 53, both of which have generally cylindrical shapes, are attached to a protruding portion of second ring 120 opposite handle 128. Also included are guide block slots 129 to provide alignment with module housing 130, which is described later.

FIG. 8B is a side view of second ring 120 and shows the placements of cam followers 122, upper cam follower 52, and lower cam follower 53. Cam followers 122 are secured to an exterior surface of second ring 120 near the bottom major surface. Upper cam follower 52 and lower cam follower 53 are mounted to second ring 120 on a side opposite from where handle 128 is mounted as was previously described.

FIG. 8C illustrates a bottom perspective view of second ring 120. From this view, four cam followers 122 can be seen. Fewer or more cam followers are contemplated. A bottom surface of second ring 120 also contains at least one alignment hole 129.

Figure 9A:
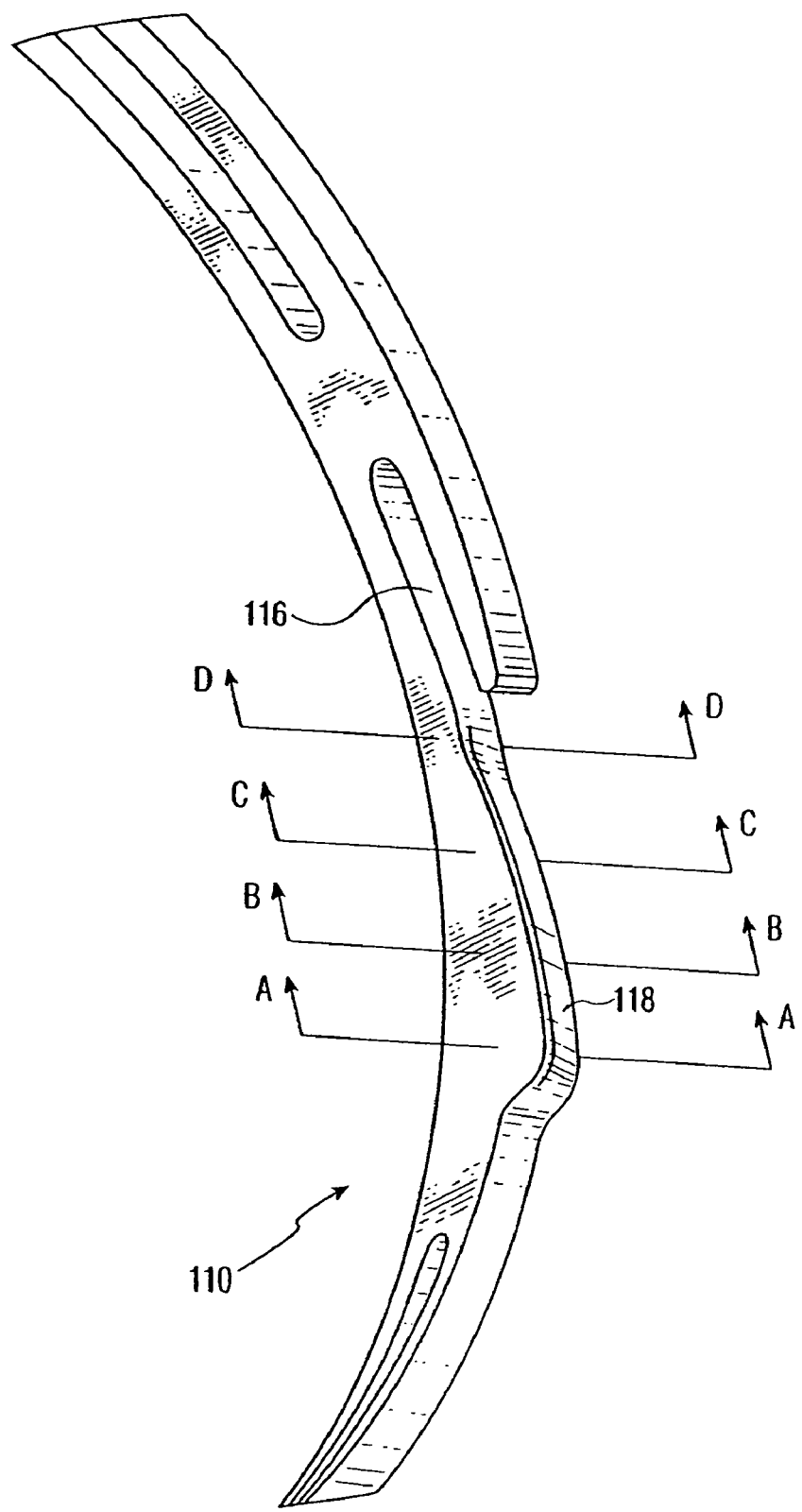
FIG. 9A is a perspective view of a compression ring with various cross sectional views indicated.
Figure 9B:
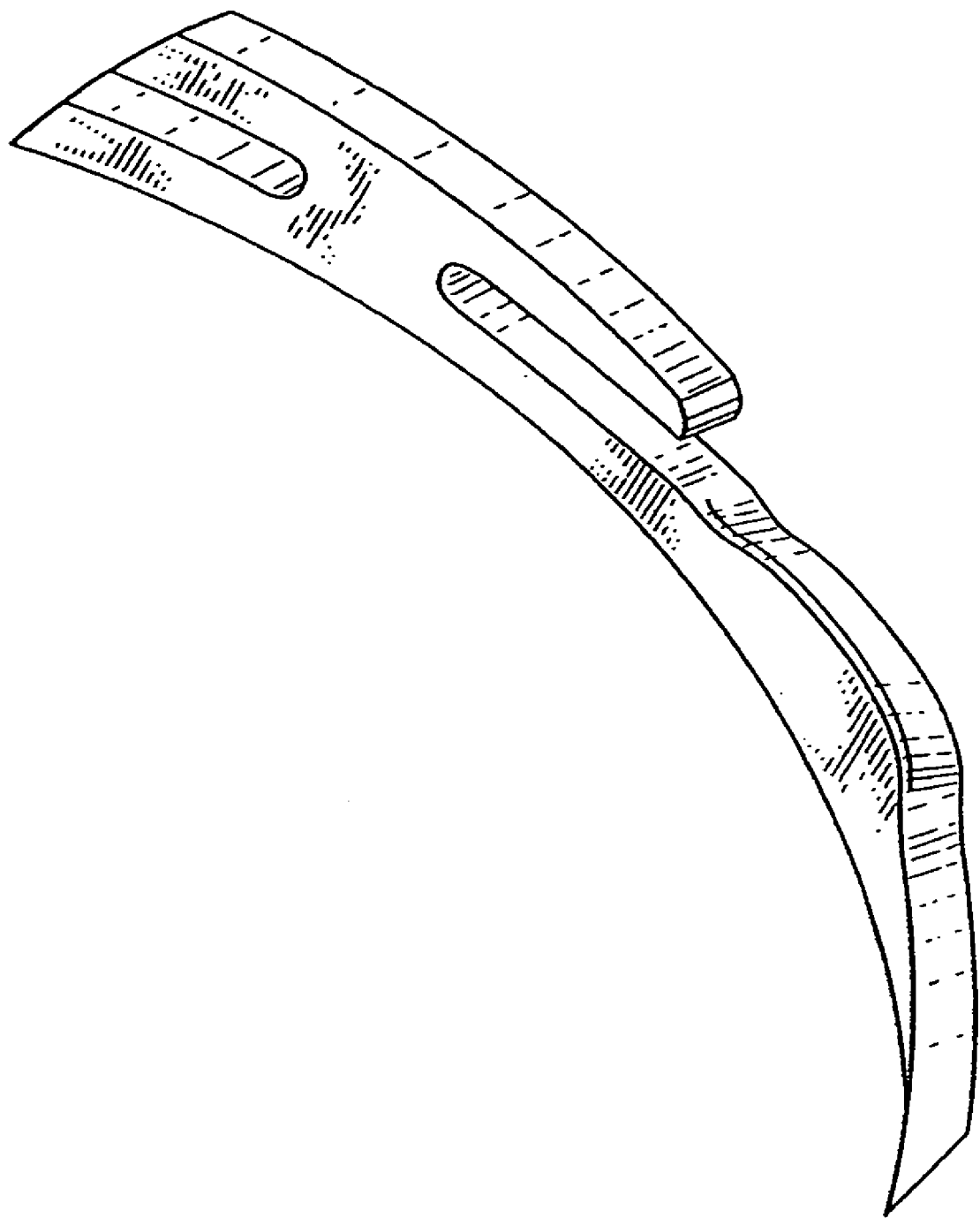
FIG. 9B is a further perspective view of the compression ring shown in FIG. 9A.
Figure 9C:
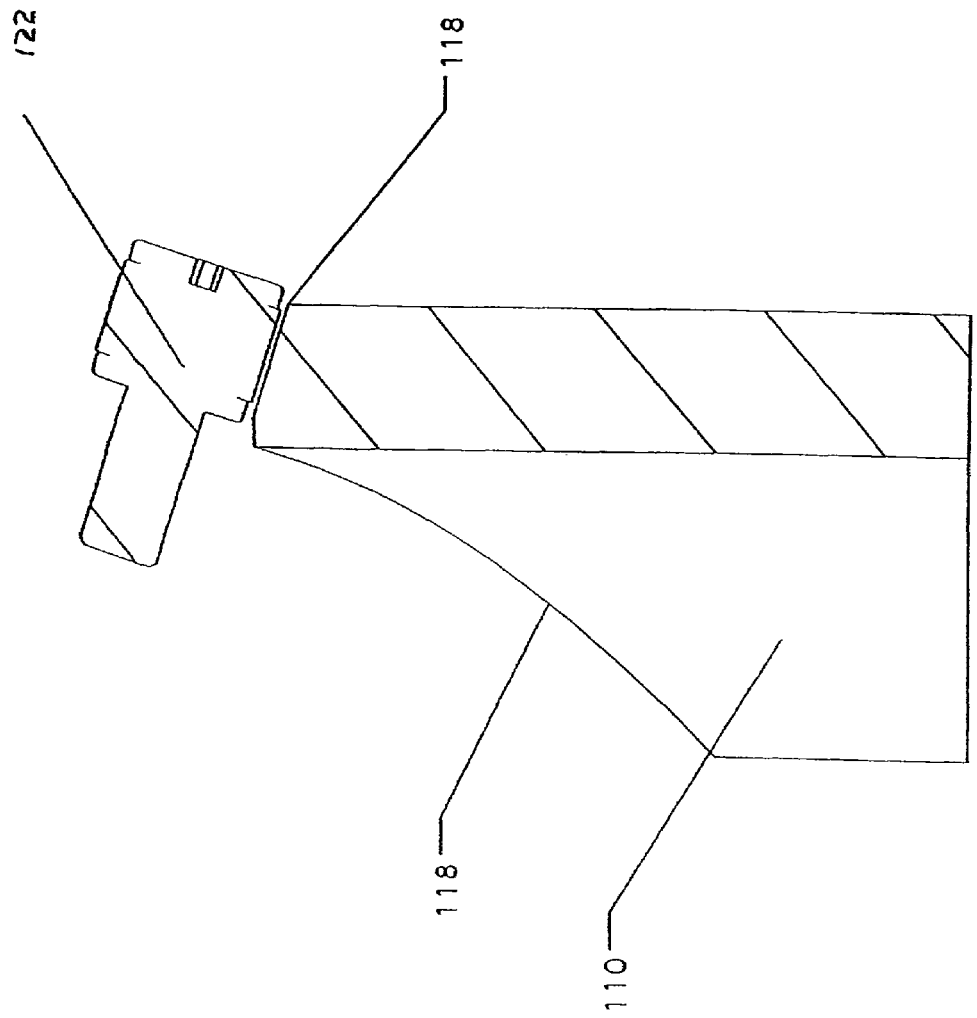
FIG. 9C is a cross-section of compression ring 110 at cross-section A-A of FIG. 9A. Cam follower 122 is also shown.

More detailed views of camming surface 118 are described with reference to FIGS. 9A through 9F. FIG. 9A indicates four cross sections A-A, B-B, C-C, and D-D which are taken of camming surface 118. Each of the four cross sections is defined by a plane that includes central axis 119. Furthermore, the twisted configuration of camming surface 118 is more clearly shown in FIG. 9B. FIG. 9C is a sectional view of compression ring 110 taken at section A-A. The portion of compression ring 110 shown in the figure is the inside curved section of compression ring 110, which is also shown in FIG. 9A. Camming surface 118 interplays with cam follower 122, which is also shown placed against camming surface 118 at the position where the axis of its cylinder of cam follower 122 is in the plane defined by section A-A. As shown in FIG. 9C, cam follower 122 is tilted so that the rotation axis of cam follower 122 is parallel with the top surface of camming surface 118, and so that the cylindrical surface of cam follower is tangent to camming surface 118. Thus, the cylindrical axis of cam follower 122 is at the previously defined angle alpha 117.

Figure 9D:
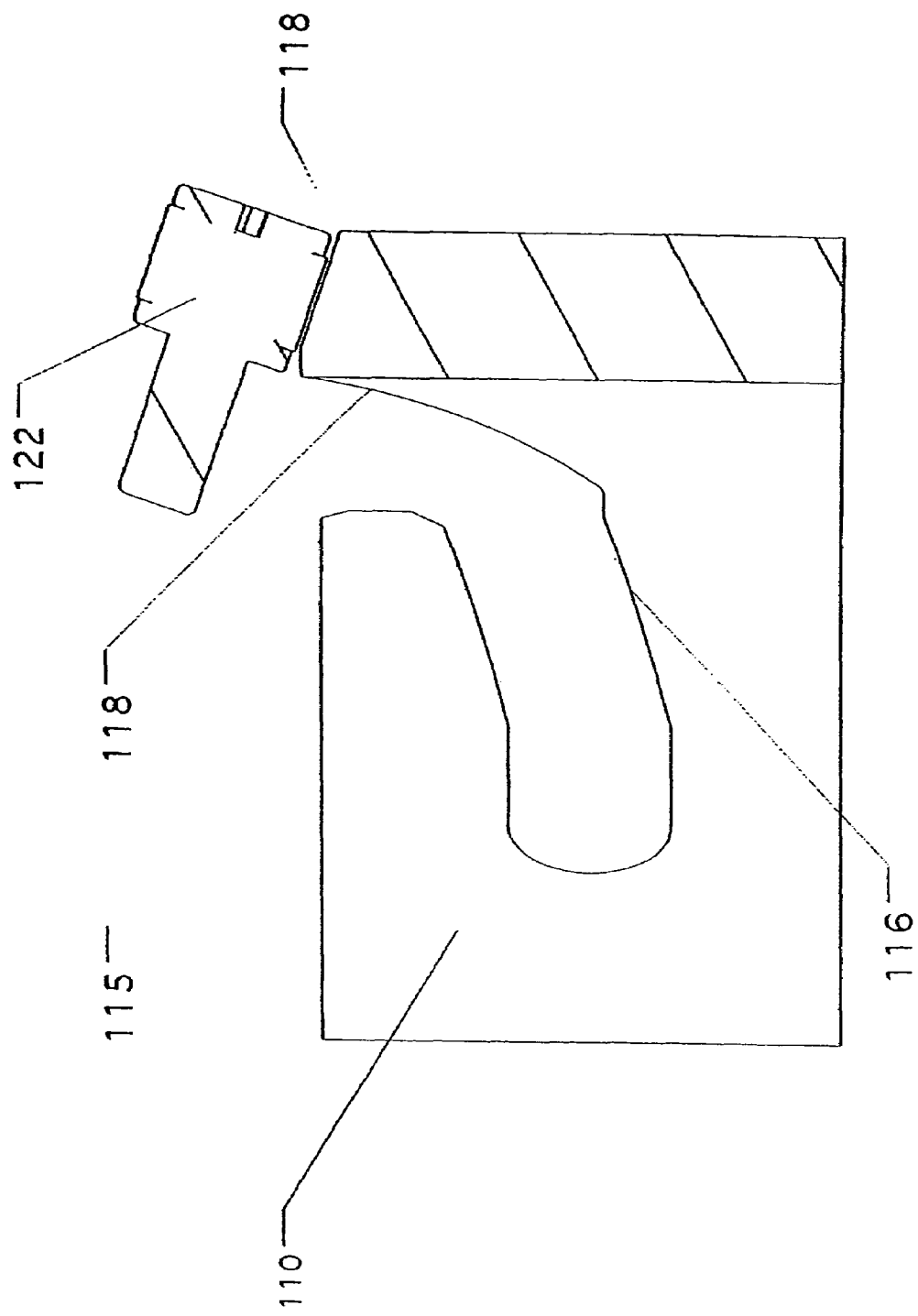
FIG. 9D is a cross-section of compression ring 110 at cross-section B-B of FIG. 9A. Cam follower 122 is also shown.
Figure 9E:
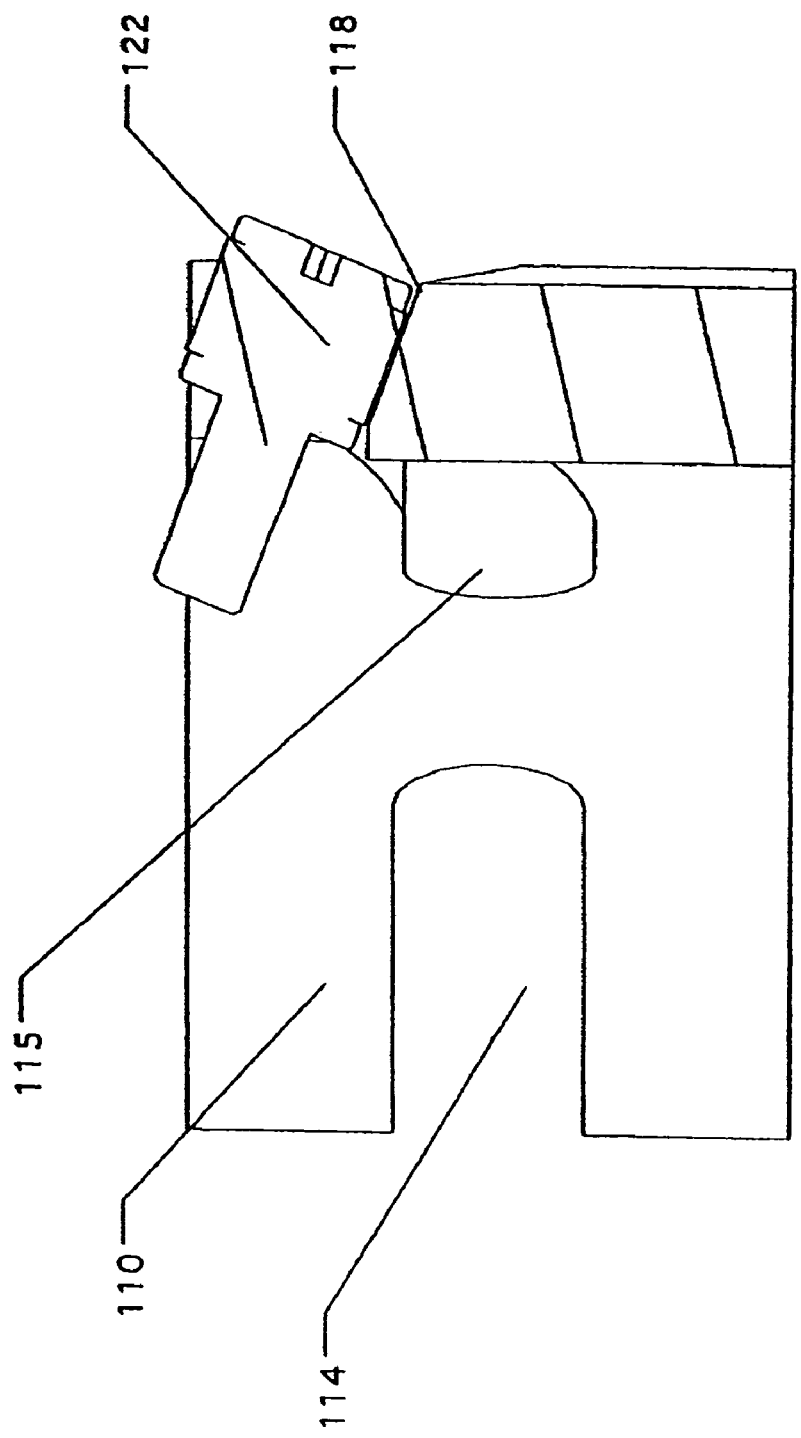
FIG. 9E is a cross-section of compression ring 110 at cross-section C-C of FIG. 9A. Cam follower 122 is also shown.
Figure 9F:
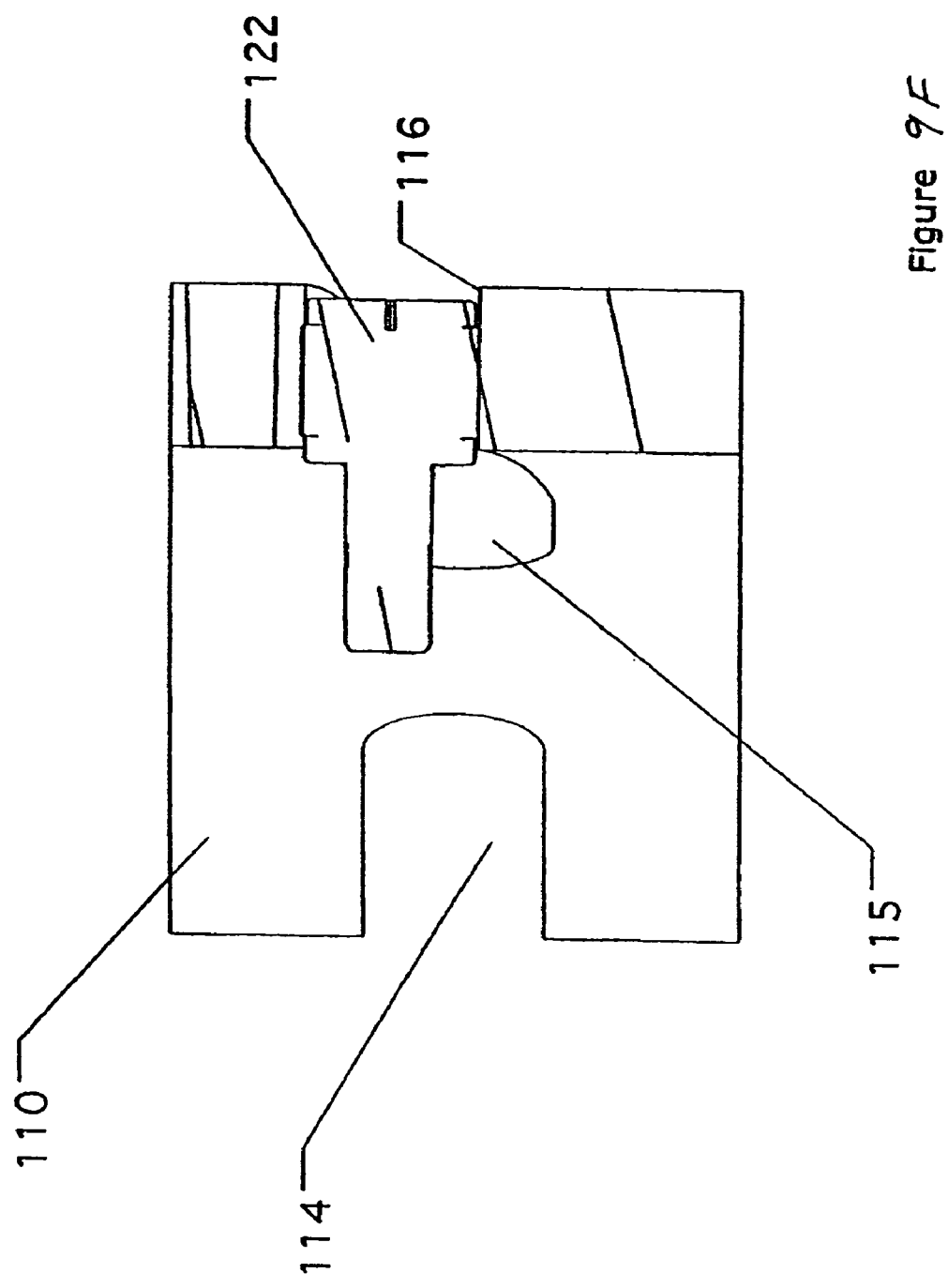
FIG. 9F is a cross-section of compression ring 110 at cross-section D-D of FIG. 9A. Cam follower 122 is also shown.

Next, in a similar manner, FIG. 9D illustrates camming surface 118 and cam follower 122 at cross section B-B. Compared to FIG. 9C, in FIG. 9D, camming surface 118 is lower than it appears in FIG. 9C and angle alpha 117 is smaller. Note, however, that the cylindrical axis of cam follower 122 is still substantially parallel with surface 118. FIG. 9E similarly illustrates camming surface 118 and cam follower 122 at cross section C-C. In FIG. 9E, camming surface 118 is still lower than it appears in FIG. 9D, and angle alpha 117 is still smaller. Again, the cylindrical axis of cam follower 122 is parallel to camming surface 118. Finally, FIG. 9F similarly illustrates camming surface 118 and cam follower 122 at cross section D-D. In FIG. 9F, camming surface 118 is shown at the point where it meets camming surface 116. The cylindrical axis of cam follower 122 is shown parallel with camming surface 116, and the angle alpha 117 has become essentially zero.

Thus, as cam follower 122 has moved along camming surface 118, the cylindrical axis of cam follower 122 has changed its angle while, at the same time, staying parallel first with camming surface 118 and then camming surface 116. This configuration reduces wear on camming surface 118 and cam follower 122.

Figure 10A:
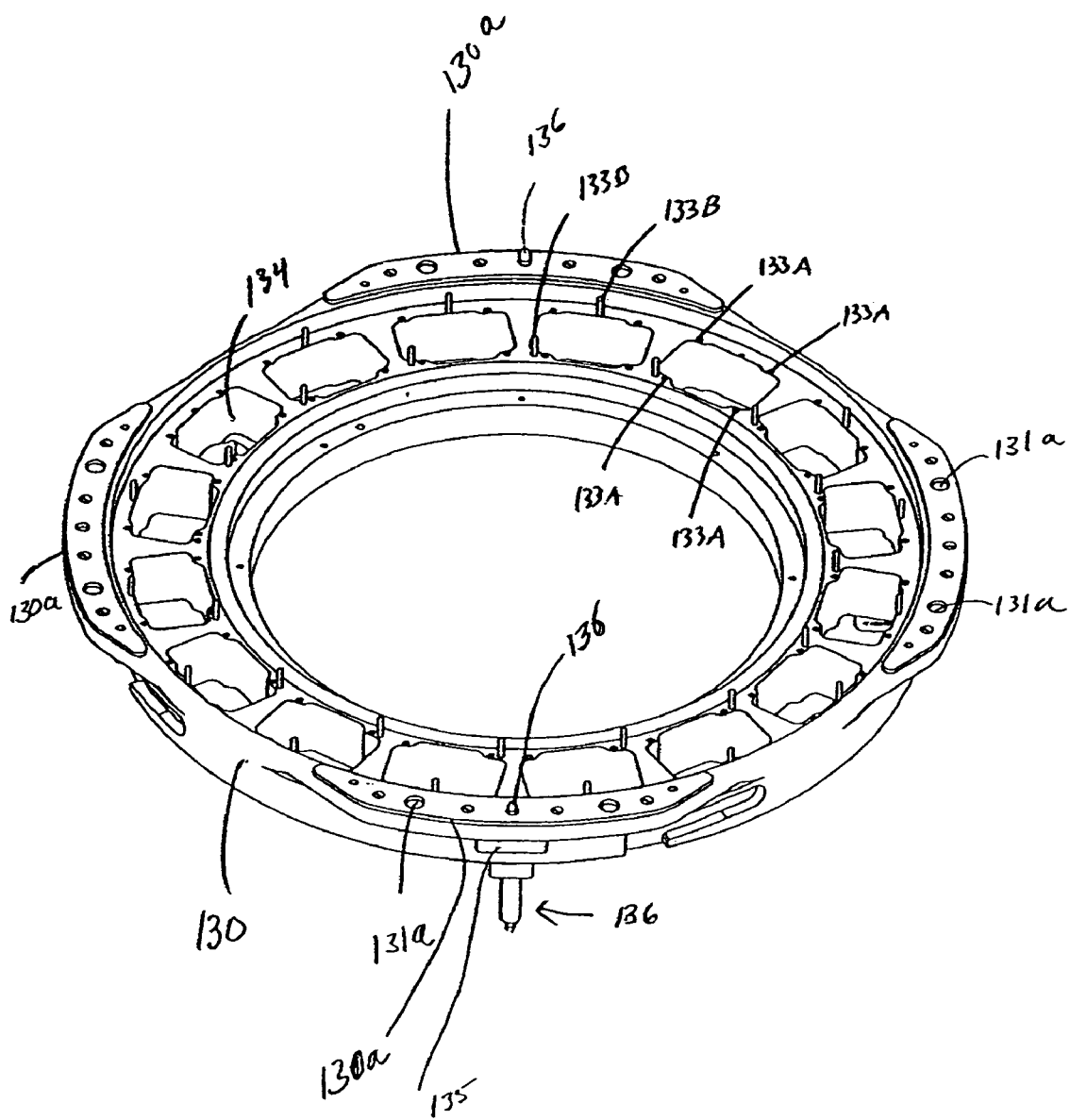
FIG. 10A is a perspective view of a module housing ring.
Figure 10B:
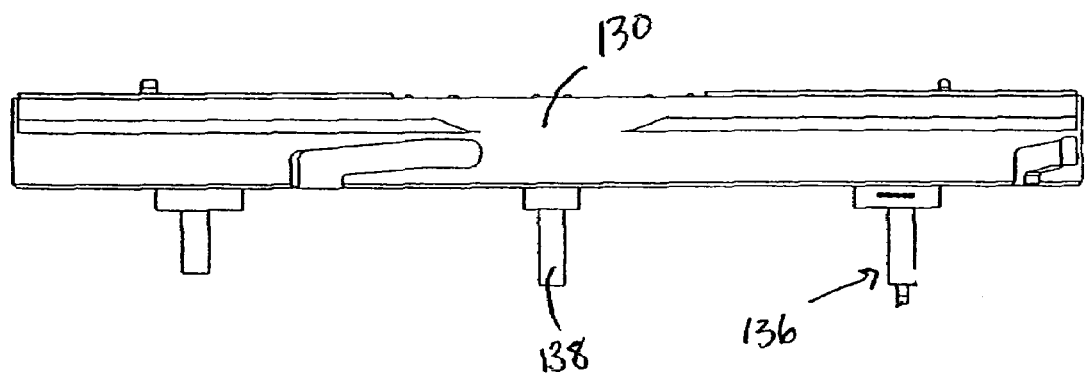
FIG. 10B is a side view of the module housing ring of FIG. 10A.
Figure 10C:
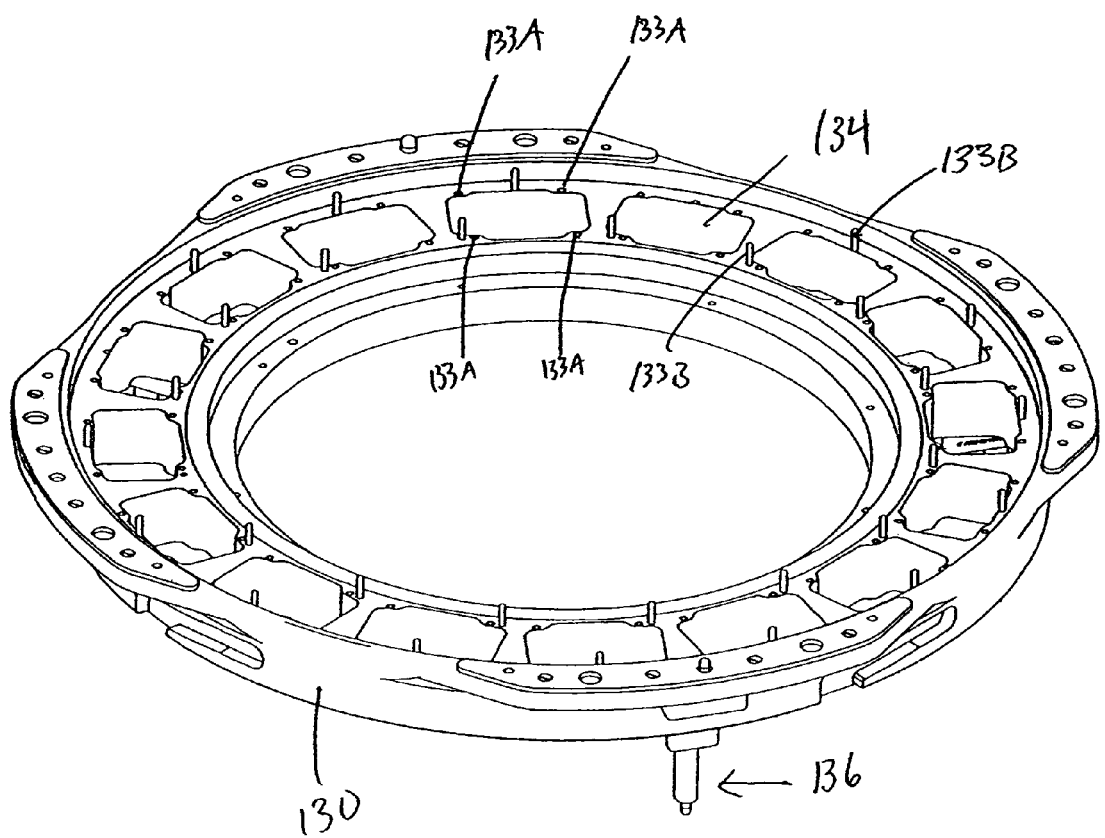
FIG. 10C is another perspective view of the module housing ring of FIG. 10A.

Shown in FIGS. 10A to 10C are various views of module housing 130. Shown in FIG. 10A is a perspective view of module housing 130 which has a generally cylindrical shape. Located within the cylindrical wall of module housing 130 is at least one module opening 134 which passes completely through from a first surface to a second surface (referred to hereinafter as "top" and "bottom" respectively). At least one spring-loaded alignment pin 136 is rigidly attached to a bottom surface of the ring. Spring-loaded alignment pin 136 is provided to provide alignment with the probe card or DUT board as the unit is closed. Not visible in FIG. 10A but shown in FIG. 10B is a second spring-loaded alignment pin 138 of a different diameter than that of pin 136. Located around module opening 134 are a plurality of screw holes 133A and module alignment pins 133B. Mounting wings 130a protruding from module housing 130 provide a number of mounting holes for various purposes. Relatively large holes 131a are used for screws to secure module housing 130 to second ring 120. Others are used to secure guide blocks 135, which fit within guide slots 129 in second ring 120, and to allow guide pins 136 to protrude through second ring 120 for the purpose aligning module housing 130 with second ring 120 as required for specific applications.

FIG. 10B shows a side view of module housing 130. Spring-loaded alignment pins 136 and 138 extend down vertically from a bottom surface of the ring. Alignment pins of different sizes are used to ensure that the probe card or DUT board is inserted in only one orientation. FIG. 10C shows another perspective view of module housing 130 similar to FIG. 10A.

Returning to FIG. 3, an explanation is now made of the manner in which assembled signal delivery system 5 is assembled. In an exemplary embodiment, signal module 132 is inserted through module opening 134 of module housing 130. A module alignment pin 133B is aligned with a module alignment hole 132B (not shown) of the signal module 132 to guarantee proper insertion and alignment. Screw 132A (not shown) is inserted into screw hole 133A to secure signal module 132 to module housing 130. In the embodiment shown in FIG. 3, module housing 139 has 16 module openings 134, and can therefore contain as many as 16 signal modules 132. Signal modules 132 can be manufactured in a range of types to provide for different numbers and patterns of electrical connections as well as different electrical and transmission line characteristics. Indeed, custom signal modules can often be designed for specific applications. All signal modules of all types are contained in housings which are of the same shape and form factor. Thus, the interface unit can be configured for different application by removing selected signal modules from a previous application and inserting different signal modules for a new application. Depending upon the application, module housing 130 may or may not be fully populated with signal modules. In place of a signal module, a dummy module described below may be used. The dummy module may lack electrical connection. The dummy module may be configured to produce the same compressive force as a signal module. Thus, the interface is easily and modularly reconfigurable. The components that comprise second signal unit 34 are now described. Module housing 130 is partially disposed within an interior opening of second ring 120, described by upper interior cylinder 126, and rests upon edge 125. Guide blocks 135 and guide block slots 129 are used to properly align the two components. The two are secured by screws which pass through holes 131a in wings 130a of module housing 130 threaded into threaded holes 121 in second ring 120. The assembly of module housing 130 and second ring 120 comprises second signal unit 34 (shown in FIG. 1).

The components that comprise first signal unit 32 are now described. Compression ring 110 is rotatably disposed within an opening of first ring 100. Guide cam followers 102 which are attached to first ring 100 extend into corresponding guide cam slot 114 of compression ring 110 to prevent compression ring 110 from moving axially up or down within the opening of first ring 100. The interplay between guide cam followers 102 and guide cam slots 114 also restricts the rotational movement of compression ring 110 to angular distances defined by the length of the arc traversed by guide cam slot 114. Because guide cam slots 114 are horizontal, their interplay with cam followers 102 maintains surface 111 of compression ring 110 in a horizontal plane.

Probe card tray 80 is secured to the bottom surface of first ring 100 by screws, which pass through fastener holes 106 of first ring 100 and engage screw holes 88 in probe card tray 80. Alignment pins 84 guarantee a proper angular orientation between first ring 100 and probe card tray 80.

Probe card or DUT board 40, rests on a support annulus 86 of probe card tray 80 and is secured thereto. Probe card alignment pins 82 of probe card tray 80 are inserted into alignment holes 42 to assure proper angular and rectilinear alignment between probe card tray 80 and probe card or DUT board 40. Thus, the alignments of first ring 100 to probe card tray 80 and probe card tray 80 to probe card or DUT board 40 assure that the conductive pads on probe card or DUT board 40 will make proper contact with signal module 132.

Figure 11:
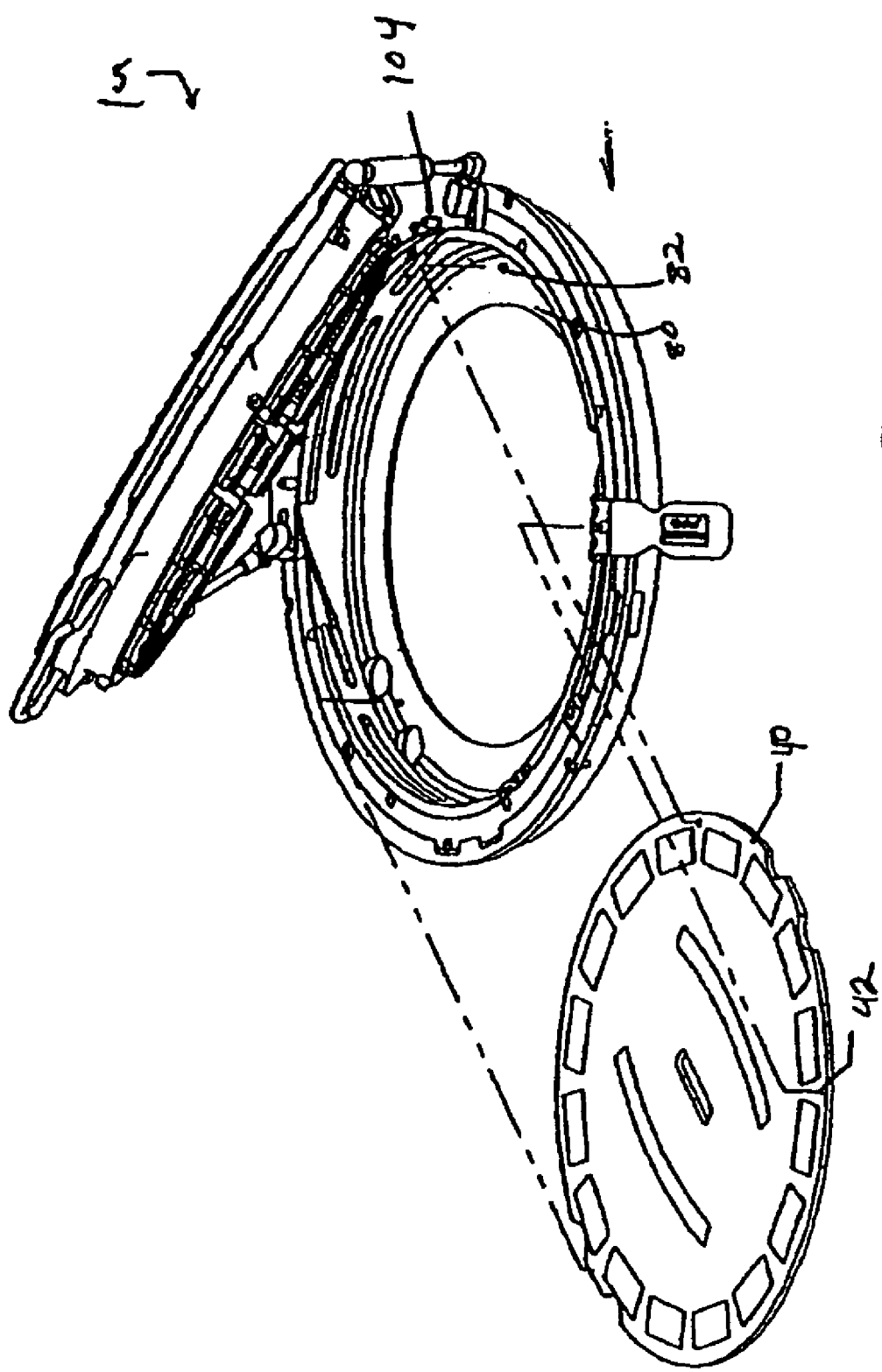
FIG. 11 is a perspective view similar to FIG. 2 showing an alignment feature of a probe card of the signal delivery system of FIG. 1 and illustrating the removal/insertion of a probe card.

As illustrated in FIG. 11, probe card or DUT board 40 can be inserted or removed from interface unit 5 when it is in an open position without need for any disassembly or reassembly of the rest of the unit. The probe card or DUT board may or may not be secured to probe card tray 80 depending upon the application. Generally, if the peripheral is a wafer prober, then the interface is secured to the top of the peripheral, and probe card 40 may be held in place by gravity. On the other hand, if the peripheral is of another type, then the interface could be secured vertically, at an angle, or in a reversed position on a bottom surface of the peripheral, In such cases probe card or DUT board 40 may be secured using screws. Alternatively, clips or other quick change device that are well known could be used to facilitate rapid changeover.

Finally, first ring 100 is disposed within an opening of prober adapter ring 90 and support edge 101D rests upon edge 97. The two rings are aligned and attached as previously described. The assembly of compression ring 110, first ring 100, probe card 40, and probe card tray 80, and prober adapter ring 80 comprises first signal unit 32 (shown in FIG. 1).

Figure 12:
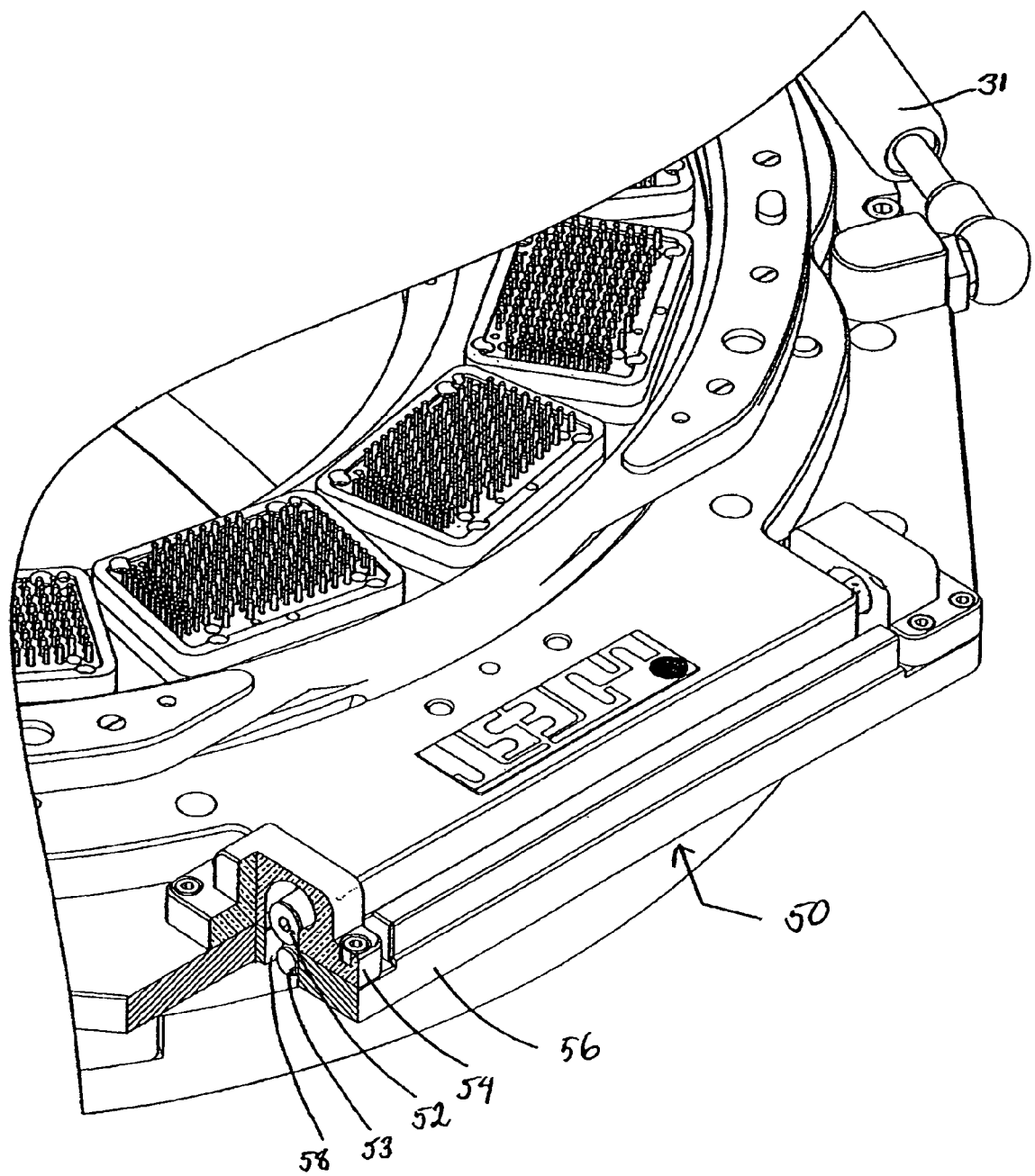
FIG. 12 is a perspective view similar to FIG. 1 with part of the pivot block and the pivot support plate cut away to show elements of the pivot assembly.

The pivot members are now described. FIG. 12. is a rear, partially-cut-away, perspective view of pivot assembly 50 which couples first signal unit 32 with second signal unit 34. FIGS. 13A-13E are partial cut-away side views of signal delivery system 5 showing pivot assembly 50 in greater detail and in various positions so that its structure and operation may be explained. Pivot assembly 50 is comprised of an upper cam follower 52, a lower cam follower 53, a pivot block 54, a pivot support plate 56, and a channel 58. Ends of pivot block 54 and pivot support plate 56 have been cut away to reveal upper cam follower 52, lower cam follower 53, and channel 58, all of which are not normally exposed as shown. It is seen that upper cam follower 52 is of larger diameter than lower cam follower 53. The linear portion of channel 58 is slightly wider than the diameter of upper cam follower 52 and 50% to 100% wider than the diameter of lower cam follower 53.

A detailed description of the pivotal motion and linear motion of signal delivery system 5 is now provided. These figures may be viewed in order from FIG. 13A to FIG. 13E to illustrate movement of second signal unit 34 toward first signal unit 32. Alternatively, these figures may be viewed in reverse order to illustrate movement of second signal unit 34 moving away from first signal unit 32.

Figure 13A:
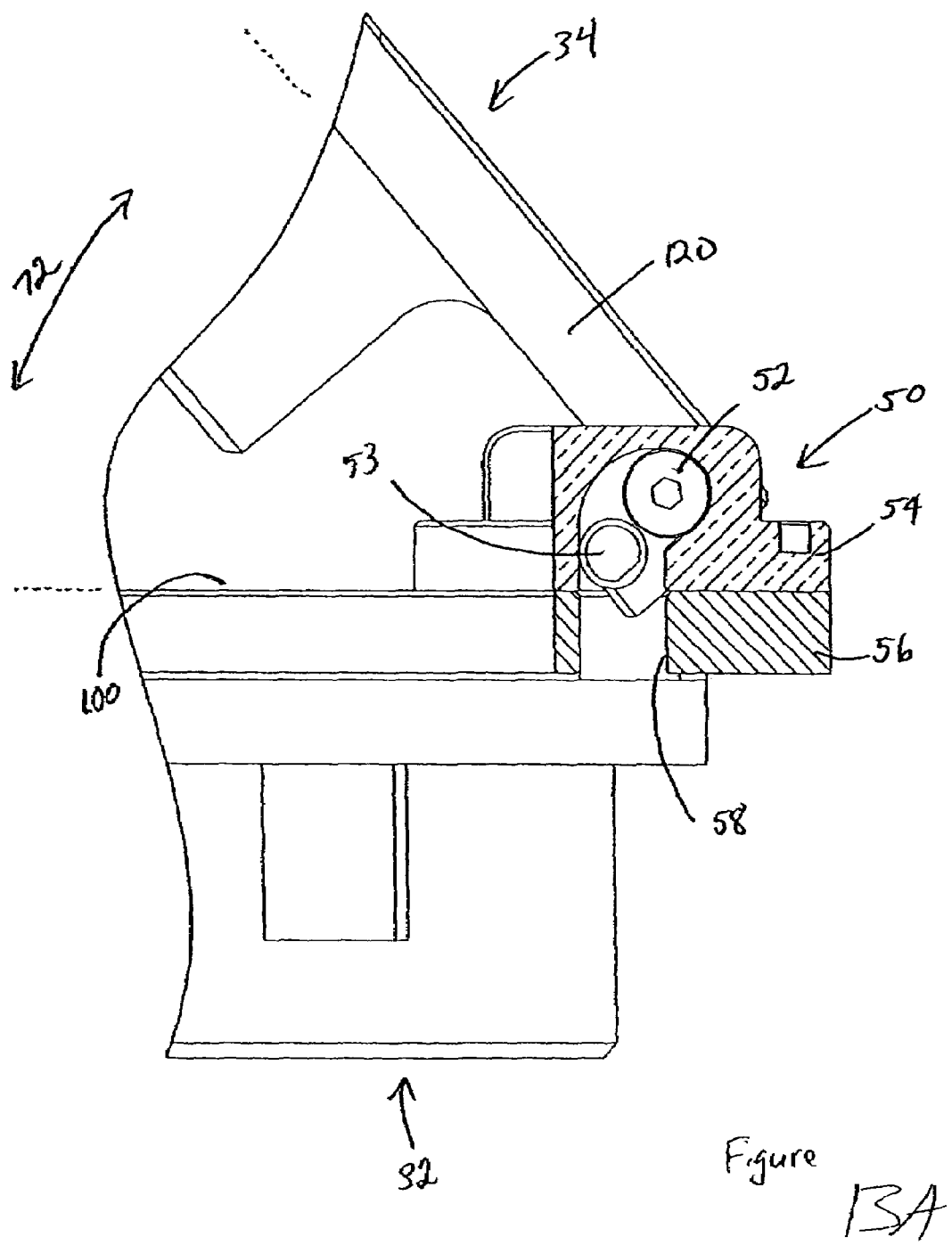
FIGS. 13A though 13E are side cut-away views similar to FIG. 12 showing the elements of the pivot assembly in various positions.

Beginning with FIG. 13A, there is shown a cut-away side view of signal delivery system 5 with ends of pivot block 54 and pivot support plate 56 cut away to expose upper cam follower 52, lower cam follower 53, and channel 58. FIG. 12A shows signal delivery system 5 in its maximally open position in which second ring unit 34 is at its greatest angular distance from first ring unit 32. In the open position, upper cam follower 52 is in a top region of channel 58, and lower cam follower 53 is at a left side of channel 58. As can be seen, the top of channel 58 contains a curved recess into which upper cam follower 52 nestles when signal delivery system 5 is maximally open. Thus, a substantial portion of the wall of upper cam follower 52 may be in contact with the wall surface of channel 58. The curved recess is primarily for manufacturing convenience; other shapes such as a squared opening will provide the same operation as will be described below. It is only necessary that channel 58 has a closed end which will contain upper cam follower 52. Also in the open position, lower cam follower 53 is located in a middle region of channel 58 and is in contact with a left wall of channel 58. Strut 31 is maximally extended (or minimally compressed) in this open position. Angle 72 is the angle between the top surface of first ring 100 and the bottom surface of second ring 120 and is at a maximum as shown. The value of angle 72 is established by the contacts of upper cam follower 52 and lower cam follower 53 with channel 58. Because angle 72 is at a maximum for the present illustration, upper cam follower 52 is nestled in an upper recess of channel 58, and lower cam follower 53 is in contact with a left surface of a midsection of channel 58. A force which tends to increase angle 72 presses upper cam follower 52 against the upper recess of channel 58 and presses lower cam follower 53 against the left wall.

Figure 13B:
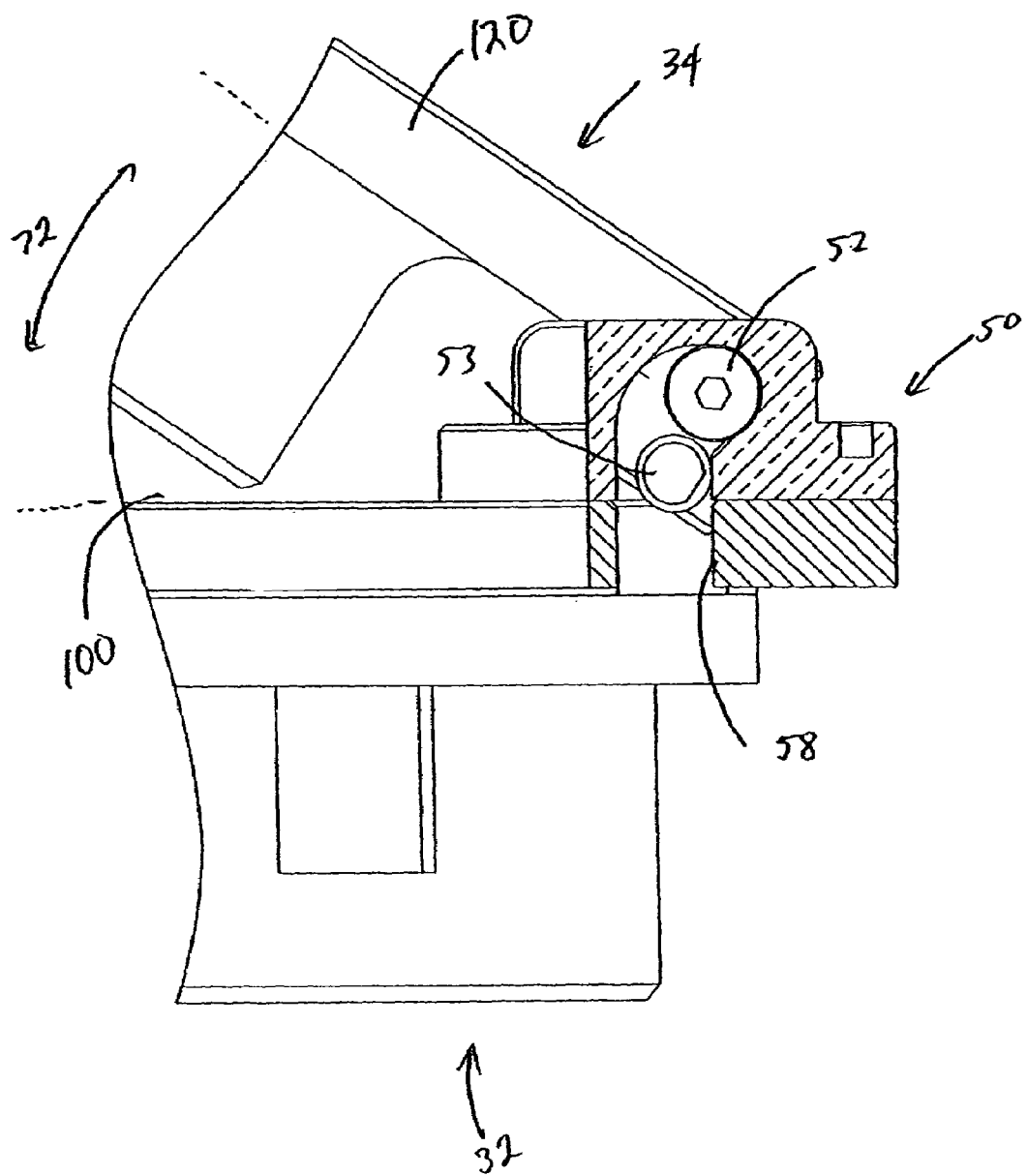

FIG. 13B depicts a decrease in angle 72 as second signal unit 34 is pivoted towards to first signal unit 32. As angle 72 decreases from its value in FIG. 13A to its value in FIG. 13B, second signal unit 34 and lower cam follower 53 pivot about the central axis of upper cam follower 52, and lower cam follower 53 ceases contact with and moves away from the left surface of channel 58. As the pivoting progresses, lower cam follower 53 pivots until it makes contact with a right surface of channel 58. During the motion between the stages shown in FIGS. 13A and 13B, upper cam follower 52 remains nestled in the upper recess of channel 58 and rotates about its own axis.

Figure 13C:
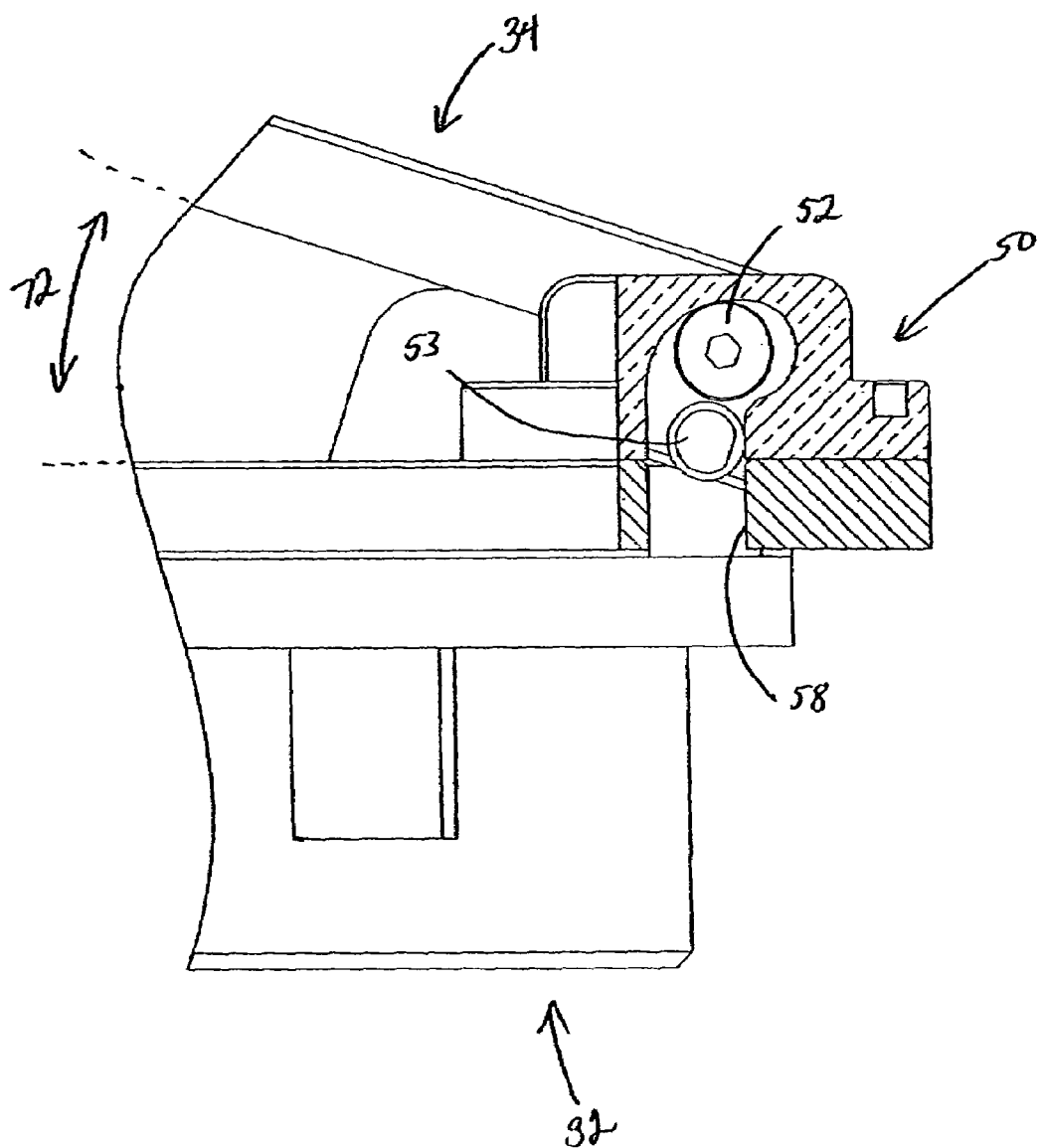

FIG. 13C shows a further decrease in angle 72. During the motion between the stages shown in FIGS. 13B and 13C, upper cam follower 52 leaves its nestling position in the upper recess of channel 58 and skims along the top curve of channel 58. The movement of upper cam follower 52 has a pivotal component as the axis of upper cam follower 52 pivots about the axis of lower cam follower 53. Lower cam follower 53 also moves, both rotationally and linearly. The rotational movement of lower cam follower 53 is the result of upper cam follower 52 leaving its nestling position, which causes lower cam follower 53 to rotate about its axis. The linear motion of lower cam follower 53 is the result of upper cam follower 52 skimming along the curved upper surface of channel 58 and being pushed closer to the bottom of channel 58 to cause the central axis of lower cam follower 53 to move linearly toward the bottom of channel 58.

Referring now to FIG. 13D, there is shown the next stage of the closing of second signal unit 34 against first signal unit 32. Angle 72 is now approximately zero degrees as the two units are substantially parallel to one another. Between the stage shown in FIG. 13C and the stage in FIG. 13D, upper cam follower 52 and lower cam follower 53 generally move down channel 58. Lower cam follower 53 remains in contact with the right surface of channel 58 as it moves linearly downward. Upper cam follower 52 moves from the curved upper surface to the left surface of channel 58 and remains in contact with channel 58 during this movement. The shape of the curved upper surface of channel 58 causes upper cam follower 52 to pivot about the central axis of lower cam follower 53 and to move linearly closer to the bottom of channel 58. The pivotal component of the motion of upper cam follower 52 causes lower cam follower 53 to rotate about its axis. At the stage shown in FIG. 13D, lower cam follower 53 is now pressed against the right surface of channel 58, and upper cam 52 is pressed against the left surface.

Figure 13E:
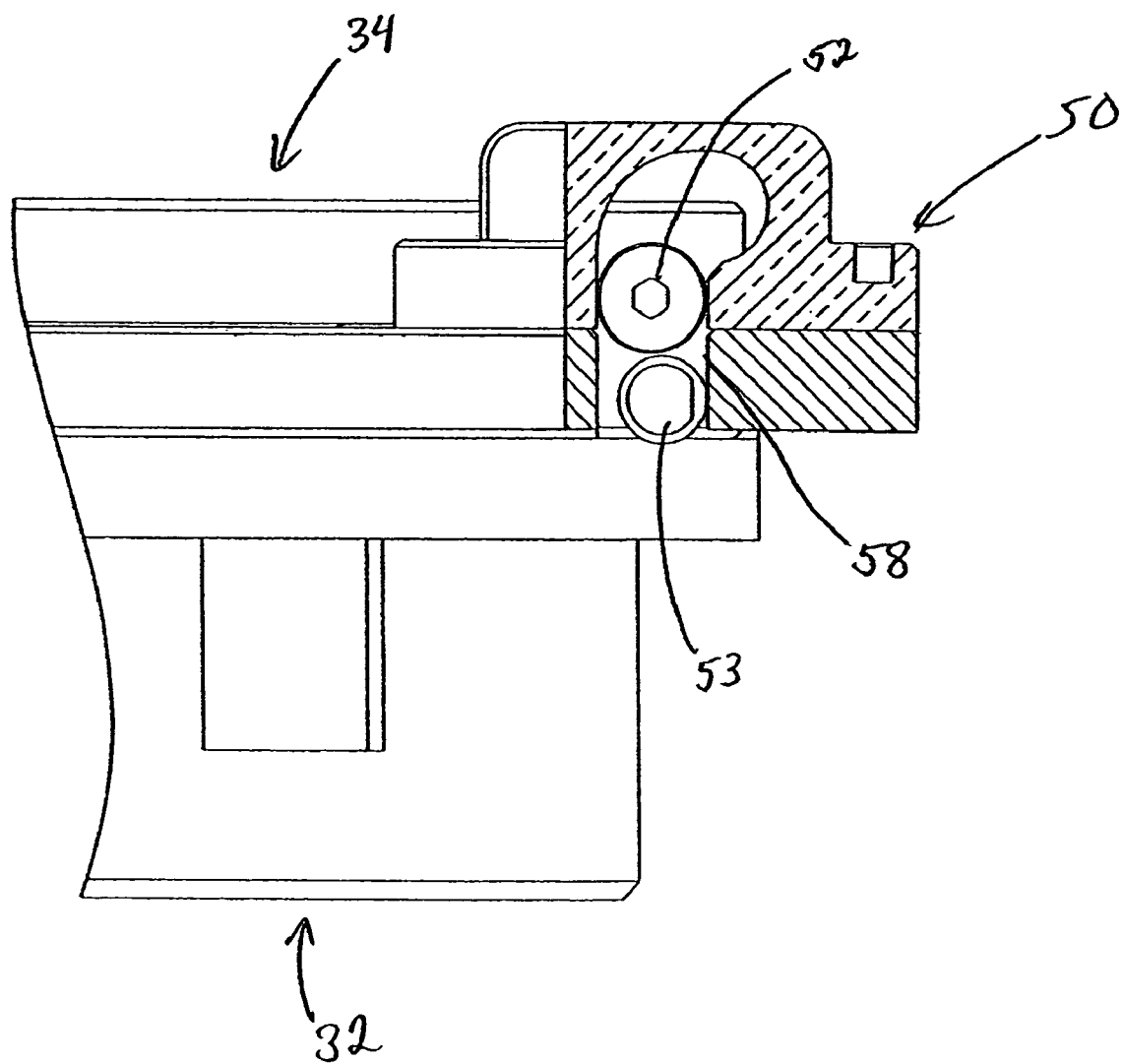

FIG. 13E shows the final stage in the progress of upper cam follower 52 and lower cam follower 53. As in FIG. 13D, angle 72 remains zero degrees. In the movement from the stage shown in FIG. 13D to that shown in FIG. 13E, second signal unit 34 moves linearly closer to first signal unit 32, and upper cam follower 52 and lower cam follower 53 move linearly closer to the bottom of channel 58. Upper cam follower 52, whose diameter is only slightly less than the width of channel 58, essentially maintains contact with the left and right surfaces of channel 58, and lower cam 53 maintains contact with the right surface. Signal delivery system 5 is shown in its maximally closed position in which second signal unit 34 is closed and locked against first signal unit 32. Upper cam follower 52 rests now in the middle region of channel 58 in contact with a left wall and a right wall of channel 58. Lower cam follower 53 is now in contact with the right wall of channel 58 in a lower region of channel 58. Strut 31 is minimally extended (or maximally compressed) in this closed position.

Closing and opening of signal delivery system 5 by an operator is now illustrated. When signal delivery system 5 is open, an operator grasps handle 128 and applies a generally downward force to pivot second signal unit 34 toward first signal unit 32. As second signal unit 34 is pivoted toward first signal unit 32, cam follower 122 comes into contact with first camming surface 118 and is drawn down along first camming surface 118 as pivoting continues. Because the axis of cam follower 122 is fixed, as it is drawn along first camming surface 118, compression ring 110 rotates. Cam follower 122 is cylindrical in shape, and the side of the cylinder contacts camming surface 118. Recall that it was previously explained that camming surface 118 is "twisted." In particular the slope of camming surface 118 makes an angle alpha 117 with respect to a plane which is orthogonal to axis 119; and, furthermore, angle alpha 117 varies at different positions along camming surface 118. Simply put, at all positions where cam follower 122 is in contact with camming surface 118, angle alpha 117 has been designed to be equal to the corresponding angle 172. In this way the contact between camming surface 118 and cam follower 122 is always a line along the side of cam follower 122 that is parallel to the axis of cam follower 122. This reduces wear in comparison to a situation where the contact between the two is a point on the edge a camming surface 118, which will eventually deform and detract from smooth operation.

Pivoting continues until spring-loaded alignment pins 136 and 138 make contact with probe card or DUT board 40 in first signal unit 32 and spring-loaded pins 108 make contact with second ring 120. At this point, compression ring has been rotated to a position where cam follower 122 is near camming slot 115, and alignment pins 104 have entered alignment holes 129 to maintain alignment between first signal unit 32 and second signal unit 34 as signal delivery system 5 is further closed. First signal unit 32 is now supported against second signal unit 34 by spring pins 136 and spring-loaded pins 108, and angle 72 is approximately zero degrees.

The user then grasps compression handle 112 and rotates it to move camming slot 115 to accept cam follower 122. As camming slot 115 is moved to accept cam follower 122, the sloped upper surface of camming slot 115 presses cam follower 122 toward the bottom of compression ring 110, and second signal unit 34 is pulled toward first signal unit 32 linearly until compression handle pin 113 engages compression handle pin slot 103. The signal delivery system 5 is now fully closed and locked.

An opening of signal delivery system 5 in which second signal unit 34 moves away from first signal unit 32 is accomplished by a reverse process of the closing of signal delivery system 5, as discussed above. When signal delivery system 5 is closed, an operator grasps handle 128 and compression handle 112 and releases compression handle pin 113 from compression handle pin slot 103. While applying a downward force on handle 128, the user then rotates compression handle 112 to move camming slot 115 to eject cam follower 122. As camming slot 115 is moved to eject cam follower 122, the sloped upper surface of camming slot 115 pushes cam follower 122 toward the top of compression ring 110. Second signal unit 34 is pushed away from first signal unit 32 linearly until cam follower 122 leaves camming slot 115. At this point, first signal unit 32 is supported by spring pins 136 and spring-loaded pins 44 against second signal unit 34, and angle 72 is approximately zero degrees.

While continuing the rotation of compression ring 110, the user allows second signal unit 34 to pivot away from first signal unit 32, assisted by struts 31. The user controls the assent of second signal unit 34 by applying downward or upward forces to handle 128. Movement continues until signal delivery system 5 is fully open.

As described above, the motions between first signal unit 32 and second signal unit 34 are assisted and constrained by pivot assembly 50. Specifically, as signal delivery system 5 starts to close from a fully-open position, shown in FIG. 13A, the shape of channel 58 and the contacts of upper cam follower 52 and lower cam follower 53 with surfaces of channel 58 restrict motion between first signal unit 32 and second signal unit 34 to pivotal motion. As the signal delivery system 5 nears a fully-closed position, shown in FIG. 12D, the shape of channel 58 and the contacts of upper cam follower 52 and lower cam follower 53 with surfaces of channel 58 restrict motion between first signal unit 32 and second signal unit 34 to linear motion until signal delivery system 5 is fully-closed, as shown in FIG. 13E.

The linear motion in the final stage of closure of signal delivery system 5 subjects spring-loaded pins 132C to compression forces and virtually no bending or sheer forces, which as described above, are damaging to such pins over time. The present invention, by virtually eliminating the bending and sheer forces applied to pins 132C, minimizes damage to pins 132C.

As previously explained, second signal unit 34 includes second ring 120, module housing 130, and at least one signal module 132. The previous figures have shown module housing 130 completely populated with a plurality of signal modules. It is understood, however, that there may be some testing configurations where module housing 130 is not completely populated with signal modules.

When a signal module 132 is in place and interface unit 5 is in its closed position, the signal module 132 provides pressure upon probe card 40 as a result of the force provided by spring loaded (i.e., pogo) pins. Without a signal module in place, the pressure normally applied by the spring-loaded pins of a signal module to probe card 40 is eliminated or reduced to zero. This will result in an imbalance about module housing 130; i.e., the pressure applied across the entire surface of probe card 40 that normally comes in contact with the signal modulesis undesireably not uniform.

Figure 14:
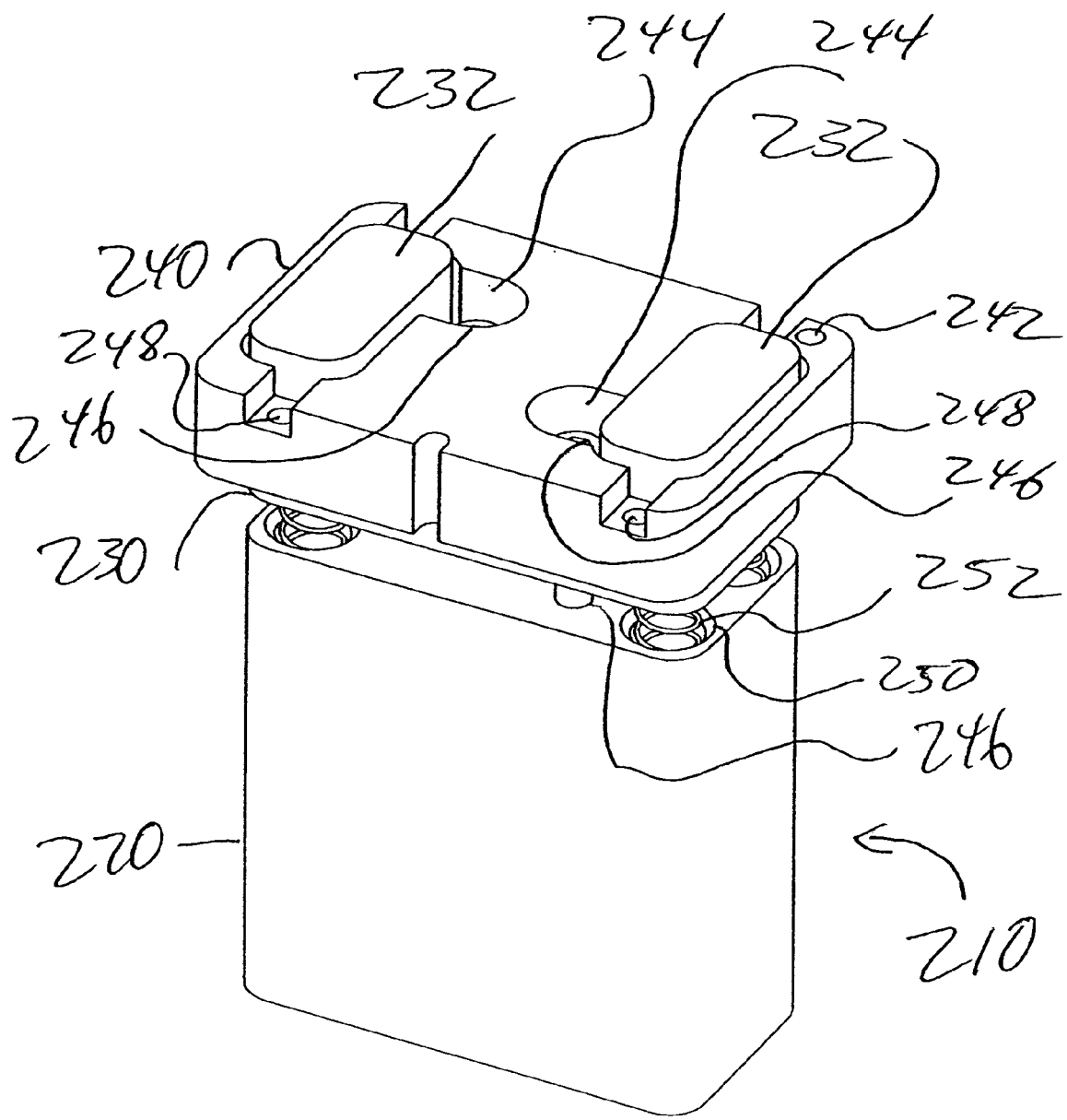
FIG. 14 is a perspective view of a dummy module.

To address the above problem, it is desirable to have a dummy module in the location where a signal module is not installed. A perspective drawing of dummy module 210 is shown in FIG. 14. Dummy module 210 includes base unit 220. A plurality of springs 252 are situated between base unit 220 and pressure plate 230. Springs 252 are situated in holes with chamfered surfaces 250. Pressure plate 230 includes protruding members 232. Retaining plate 240 is situated above pressure plate 230. Retaining plate 240 includes wells 244 in which are inserted shoulder screws 246. Shoulder screws 246 extend through pressure plate 230 and into base unit 220. Retaining plate mounting holes 242 and 248 are also included. Dummy module 210 is secured to module housing 130 by inserting screws into, for example, signal unit mounting holes 242 and 248 and engaging them with screw holes 133A in module housing 130.

Figure 15:
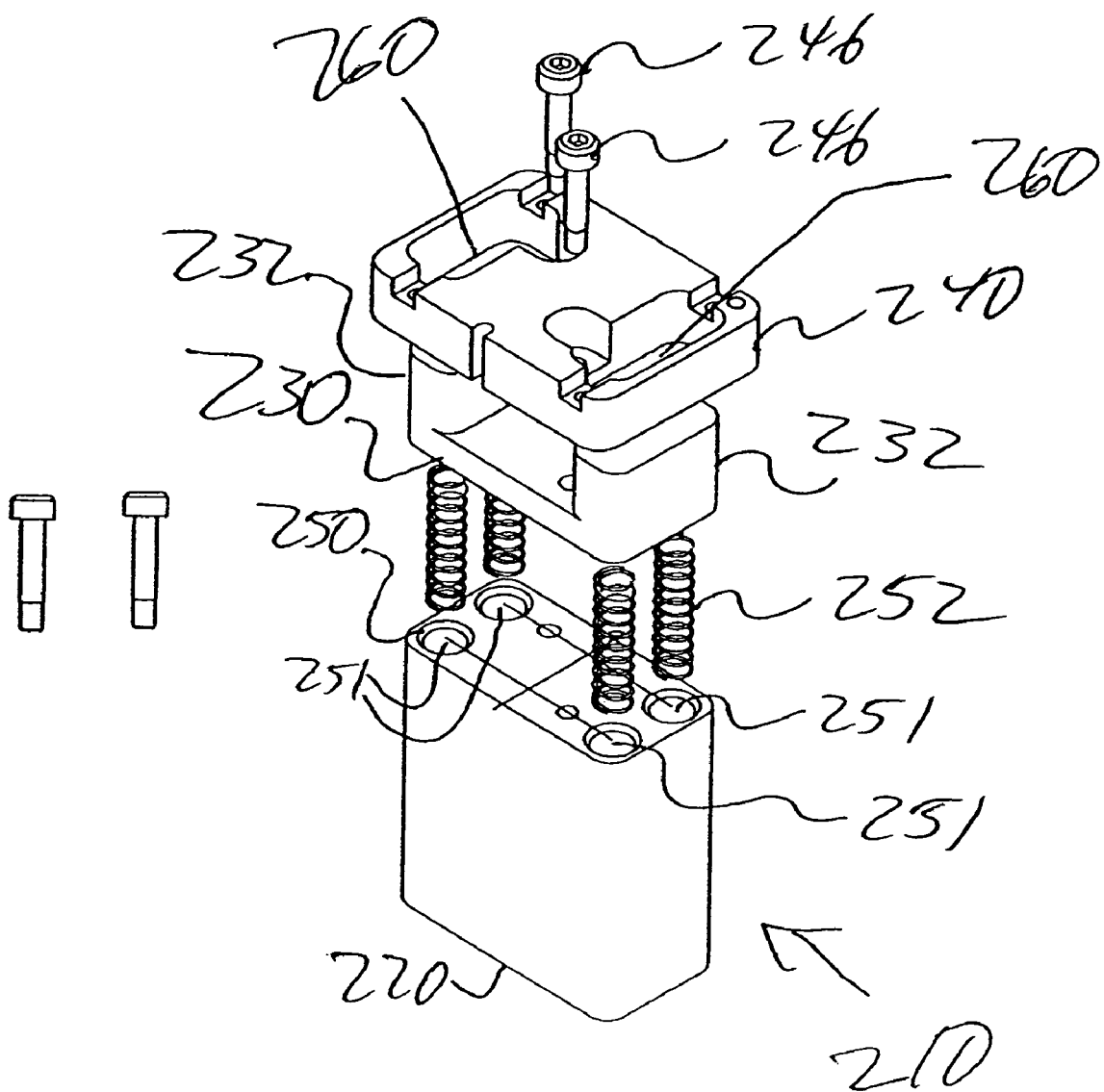
FIG. 15 is an exploded perspective view of a dummy module.
Figure 16:
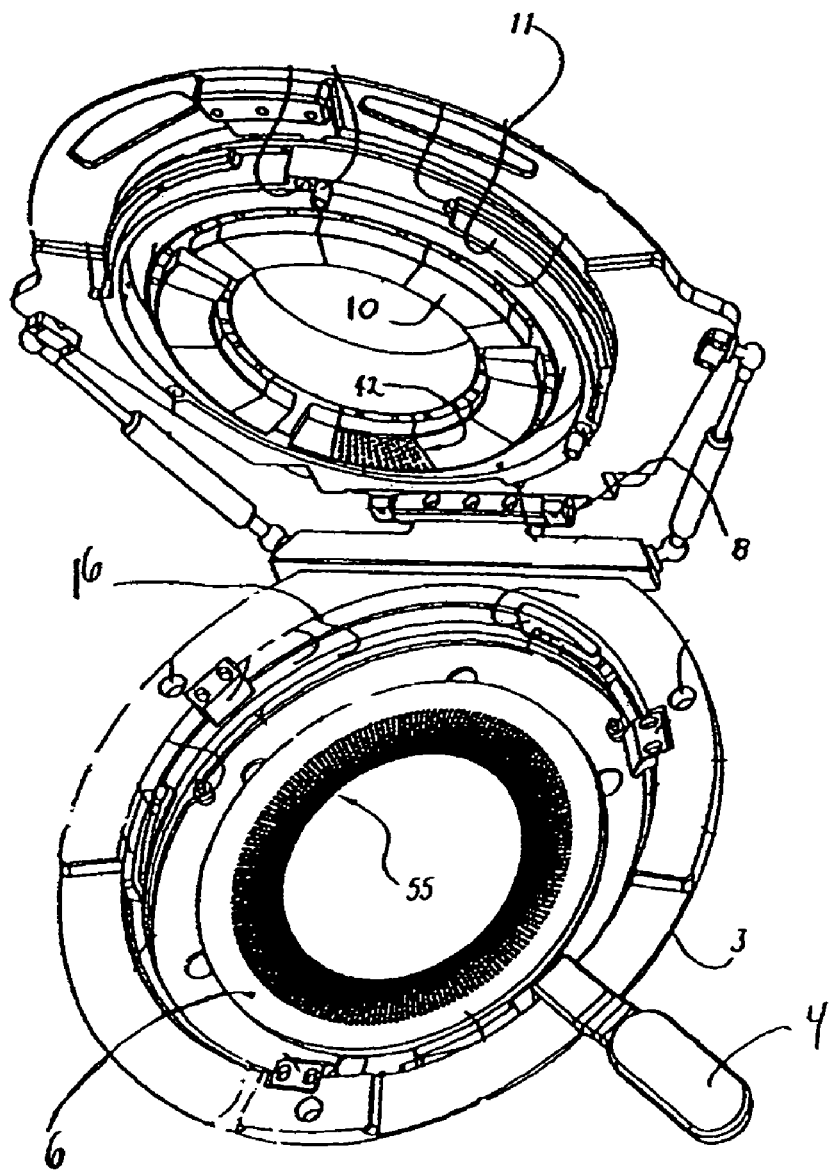
FIG. 16 is a perspective view of a prior art signal delivery system.

An exploded perspective view of dummy module 210 is shown in FIG. 15. Base unit 220 includes openings 251 with chamfered surfaces 250. Springs 252 are inserted into openings 251. Springs 252 are also inserted into pressure plate 230 through openings (not shown). Pressure plate 230 includes protruding members 232. Protruding members 232 extend through openings 260 formed in retaining plate 240. Shoulder screws 246 extend through openings in retaining plate 240, through further openings in pressure plate 230 and are secured into base unit 220.

As previously explained, dummy module 210 is used in place of signal module 132 in second signal unit 34. Springs 252 are chosen so that dummy module 220 provides an amount of pressure substantially equal, for example, to that which is provided by signal module 132, thus desirably delivering a more uniform and balanced force around module housing 130 and across the surface area of probe card 40 which normally comes in contact with an interface.

While preferred embodiments of the invention have been shown and described herein, it will be understood that such embodiments are provided by way of example only. Numerous variations, changes and substitutions will occur to those skilled in the art without departing from the spirit of the invention. Accordingly, it is intended that the appended claims cover all such variations as fall within the spirit and scope of the invention.

What is claimed is:

1. An Interface unit for electrically interfacing a test system with a peripheral system, comprising:
   a first unit having a first connection member for providing electrical communication with said peripheral system;
   a second unit having a second connection member for providing electrical communication with said test system;
   pivot members coupling said first unit and said second unit,
   said pivot members enabling motion in the following sequence as at least one of the second unit and the first unit moves towards the other:
   a) clam shell like pivotal motion between respective contact surfaces of said first connection member and said second connection member; and
   b) linear motion which decreases linear distance between said first connection member and said second connection member while maintaining respective contact surfaces of said first and second connection members in parallel;
   said pivot members enable motion in the following sequence as at least one of the second unit and the first unit moves away from the other:
   a) linear motion which increases linear distance between said first connection member and said second connection member while maintaining respective contact surfaces of said first and second connection members in parallel; and
   b) pivotal motion between said first connection member and said second connection member.

2. The interface unit of claim 1, wherein said pivot members include:
   a pivot support plate which is attached to the first or second unit;
   a pivot block which is attached to the pivot support plate;
   at least a cam which is attached to the other of the first and second unit; and
   a channel which is formed within the pivot block and the pivot support plate, which channel engages the cam, and which channel is shaped so that said pivotal motion occurs.

3. The interface unit of claim 2, wherein the channel is shaped so that said linear motion occurs.

4. The interface unit of claim 1, wherein the second unit includes:
   module probe pins which provide a linear spring-like force between the first unit and the second unit for forming the electrical communication with the test system, which linear spring-like force tends to linearly push the first unit away from the second unit;
   signal modules which hold the module probe pins;
   module openings for separately mounting the signal modules, which signal modules are separately removable from the module openings; and
   a module mounting ring which comprises the module openings.

5. The interface unit of claim 4, wherein the second unit includes:
   dummy modules which provide the linear spring-like force to balance the linear spring-like force provided by the module probe pins of the signal module, which dummy modules are separately mounted in the module openings and are separately removable from the module openings.

6. The interface unit of claim 1, further comprising:
   a spring-like member with two ends, which spring-like member is connected to the first unit by the one end and is connected to the second unit by the other end, which spring-like member provides a pivotal spring-like force between the first unit and the second unit, which pivotal spring-like force tends to pivot the first unit away from the second unit.

7. The Interface unit of claim 1, wherein the first unit includes:
   a peripheral adapter subunit for interfacing and adapting the interface unit with the peripheral system; and
   a first subunit, which is disposed within an opening of the peripheral adapter subunit and to which the pivot members are attached.

8. The interface unit of claim 7, wherein the first unit includes:
- a compression subunit with a major top surface and a major bottom surface, which compression subunit is rotatably disposed within an opening of the first subunit;
- a first camming surface which is sloped down away from the major top surface toward the bottom major surface, which first camming surface has a top end and a bottom end and which is located within the compression subunit;
- a second camming surface which is located within the compression subunit and which is connected to the first camming surface at the bottom end of the first camming surface and which slopes down away from the first camming surface toward the bottom major surface;
- a camming slot which is located in the compression subunit and which comprises the second camming surface and which is open to the bottom end of the first camming surface where the second camming surface is connected to the first camming surface; and
- a connection between the first camming surface and the second camming surface, which connection is substantially smooth.

9. The interface unit of claim 8, wherein the second unit includes:
- a cam follower which makes contact with the first camming surface as the second unit is pivoted toward the first unit and which is drawn down upon the first camming surface as the second unit is further pivoted toward the first unit and which is then drawn into the camming slot as the compression unit is rotated within the first subunit and as the second unit is pressed toward the first unit.

10. The interface unit of claim 1, said first signal unit having a first ring with camming surfaces;
- said second unit having a second ring with cams; and
- said first or second ring rotatable to cause said linear motion.

11. The interface unit of claim 10, said camming surfaces of variable angle relative to a side of said ring.

12. The interface unit of claim 10, said camming surfaces of variable angle relative to a side of said ring so that a surface of said cams remains parallel with said camming surfaces as said first or second ring is rotated.

13. A signaling unit situated between a circuit and a test head which transmits test signals to said circuit and evaluates output signals generated by said circuit responsive to said test signals, said signaling unit including:
a) a frame having a plurality of identically shaped openings: and
b) signal modules situated in each of said openings, respectively, said signal modules shaped correspondingly to said openings, said signal modules having module probe pins on top and bottom sides thereof, said module probe pins provide a linear spring-like force along respective axes thereof, said module probe pins provide electrical communication between said circuit and said test head, said module probe pins in any of a plurality of configurations.

14. A signaling unit according to claim 13, wherein said spring-like force urges said frame away from a further unit situated between said frame and one of said test head and said circuit.

* * * * *